US012334446B2

(12) United States Patent
Wu et al.

(10) Patent No.: US 12,334,446 B2
(45) Date of Patent: Jun. 17, 2025

(54) SEMICONDUCTOR PACKAGE AND METHOD

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW); Chung-Shi Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/745,613

(22) Filed: Jun. 17, 2024

(65) Prior Publication Data

US 2024/0339408 A1 Oct. 10, 2024

Related U.S. Application Data

(62) Division of application No. 17/412,966, filed on Aug. 26, 2021, now Pat. No. 12,051,650.

(51) Int. Cl.
*H01L 21/48* (2006.01)
*H01L 23/498* (2006.01)
(Continued)

(52) U.S. Cl.
CPC ...... *H01L 23/5383* (2013.01); *H01L 21/4857* (2013.01); *H01L 21/486* (2013.01); *H01L 23/49816* (2013.01); *H01L 23/49822* (2013.01); *H01L 23/49833* (2013.01); *H01L 25/0652* (2013.01); *H01L 25/50* (2013.01); *H01L 24/16* (2013.01); *H01L 24/32* (2013.01); *H01L 24/73* (2013.01); *H01L 2224/16227* (2013.01);
(Continued)

(58) Field of Classification Search
CPC .......................... H01L 23/4857; H01L 21/486
See application file for complete search history.

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

CN 109786262 A 5/2019
CN 110299351 A 10/2019
(Continued)

*Primary Examiner* — Errol V Fernandes
(74) *Attorney, Agent, or Firm* — Slater Matsil, LLP

(57) ABSTRACT

A semiconductor structure includes a first redistribution structure, a first local interconnect component disposed on the first redistribution structure, and a first interconnect structure over a second side of the first local interconnect component. The first local interconnect component includes a first plurality of redistribution layers. The first plurality of redistribution layers includes a first plurality of conductive features on a first side of the first local interconnect component. Each of the first plurality of conductive features are coupled to respective conductive features of the first redistribution structure. The first interconnect structure includes a second plurality of conductive features and a third plurality of conductive features. The second plurality of conductive features are electrically coupled to the third plurality of conductive features through the first local interconnect component.

20 Claims, 28 Drawing Sheets

(51) Int. Cl.
*H01L 23/538* (2006.01)
*H01L 25/00* (2006.01)
*H01L 25/065* (2023.01)
*H01L 23/00* (2006.01)

(52) U.S. Cl.
CPC ............... *H01L 2224/32225* (2013.01); *H01L 2224/73204* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,761,571 B2 | 9/2017 | Scanlan | |
| 2011/0291288 A1 | 12/2011 | Wu et al. | |
| 2012/0037411 A1 | 2/2012 | Hsu et al. | |
| 2017/0062383 A1 | 3/2017 | Yee et al. | |
| 2018/0315720 A1 | 11/2018 | Liao et al. | |
| 2019/0006264 A1 | 1/2019 | Vaidya et al. | |
| 2019/0103353 A1 | 4/2019 | Liu et al. | |
| 2019/0148276 A1 | 5/2019 | Chen et al. | |
| 2019/0148329 A1 | 5/2019 | Ting et al. | |
| 2019/0295972 A1 | 9/2019 | Tsai et al. | |
| 2020/0006214 A1 | 1/2020 | Tsai et al. | |
| 2020/0020638 A1 | 1/2020 | Heo et al. | |
| 2020/0075488 A1 | 3/2020 | Wu et al. | |
| 2020/0083179 A1 | 3/2020 | Lee et al. | |
| 2020/0105635 A1 | 4/2020 | Yu et al. | |
| 2021/0082871 A1 | 3/2021 | Wu et al. | |
| 2021/0167051 A1 | 6/2021 | Yu et al. | |
| 2021/0225809 A1 | 7/2021 | Yu et al. | |

FOREIGN PATENT DOCUMENTS

| | | |
|---|---|---|
| CN | 110891368 A | 3/2020 |
| DE | 102019113476 A1 | 3/2020 |
| EP | 3605603 A1 | 5/2020 |
| KR | 20180051611 A | 5/2018 |
| KR | 20190055683 A | 5/2019 |
| KR | 20200027419 A | 3/2020 |
| TW | 201843750 | 12/2018 |
| TW | 201916304 | 4/2019 |
| TW | 201942986 | 11/2019 |
| TW | 202002227 A | 1/2020 |
| TW | 202006913 A | 2/2020 |
| TW | 202114100 A | 4/2021 |
| WO | 2019132965 A1 | 7/2019 |

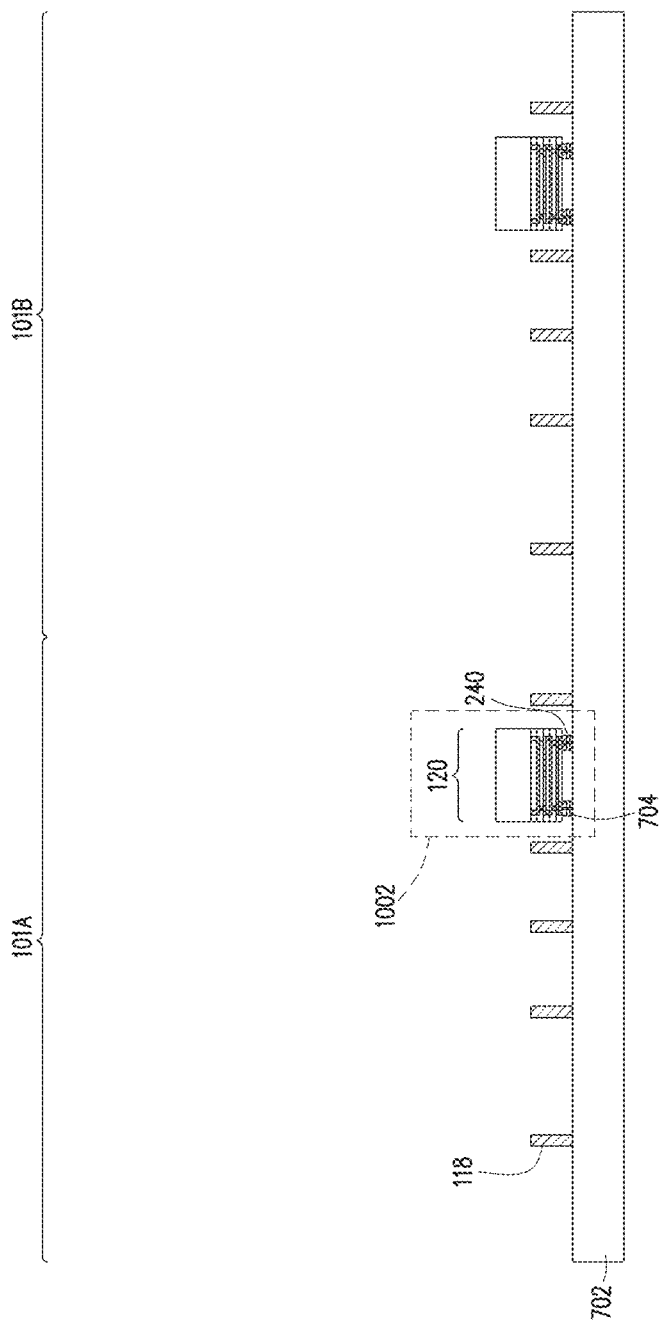

SEMICONDUCTOR PACKAGE AND METHOD

CLAIM TO PRIORITY

This application is a divisional of and claims priority to U.S. patent application Ser. No. 17/412,966, filed on Aug. 26, 2021, and entitled "Semiconductor Package and Method," which application is incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
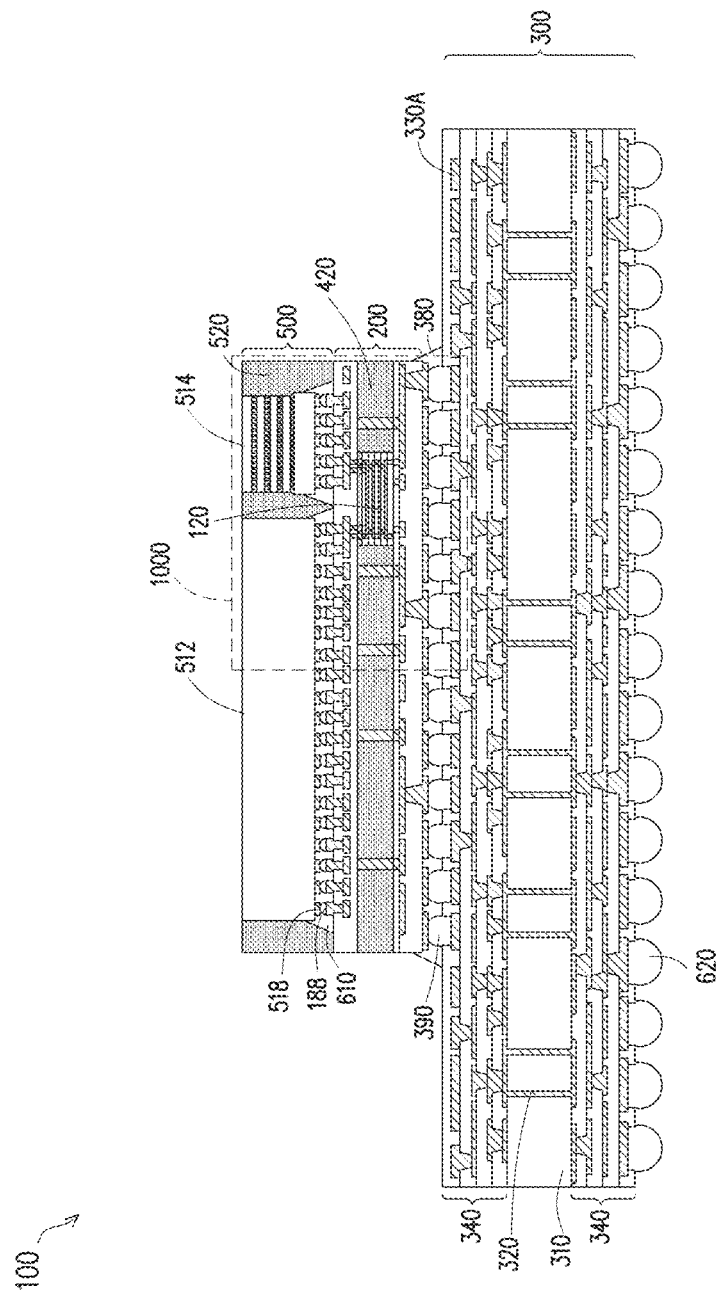
FIG. 1 illustrates a cross-sectional view of a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package component which has one or more integrated circuit dies. In some embodiments, the package component is a system-on-integrated-substrate (SoIS) package. The package component includes a double-sided local interconnect component embedded in a redistribution structure. The embedded double-sided local interconnect component may provide electrical connection between the integrated circuit dies. The embedded local interconnect component may increase the communication bandwidth between the integrated circuit dies while maintaining low contact resistance and high reliability. The double-sided local interconnect connections may achieve high signal integrity and power integrity, and may enable power distribution networks to be managed through the two-sided connection without a significant voltage drop.

The redistribution structure is connected to the integrated circuit dies and provides electrical connection between the integrated circuit dies and a core substrate and/or between the integrated circuit dies. The core substrate is additionally connected to a set of external conductive features. In such a manner, the integrated circuit dies are electrically connected to the core substrate, and ultimately to the external conductive features, through the core substrate and the redistribution structure.

In accordance with some embodiments, the redistribution structure, the embedded double-sided local interconnect component, the core substrate, and the integrated circuit dies may be individually fabricated and tested prior to assembling the completed package component. This further increases component and board level reliability.

Due to the increased communication bandwidth between the integrated circuit dies provided by the double-sided local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

The use of double-sided local interconnect components formed without adhesives such as die attach films may allow the reliability window to be enlarged. Omitting a grinding process step to remove the adhesive may reduce the formation of compound cracks between attached integrated circuit dies, improving the reliability of the device.

Figure 2:
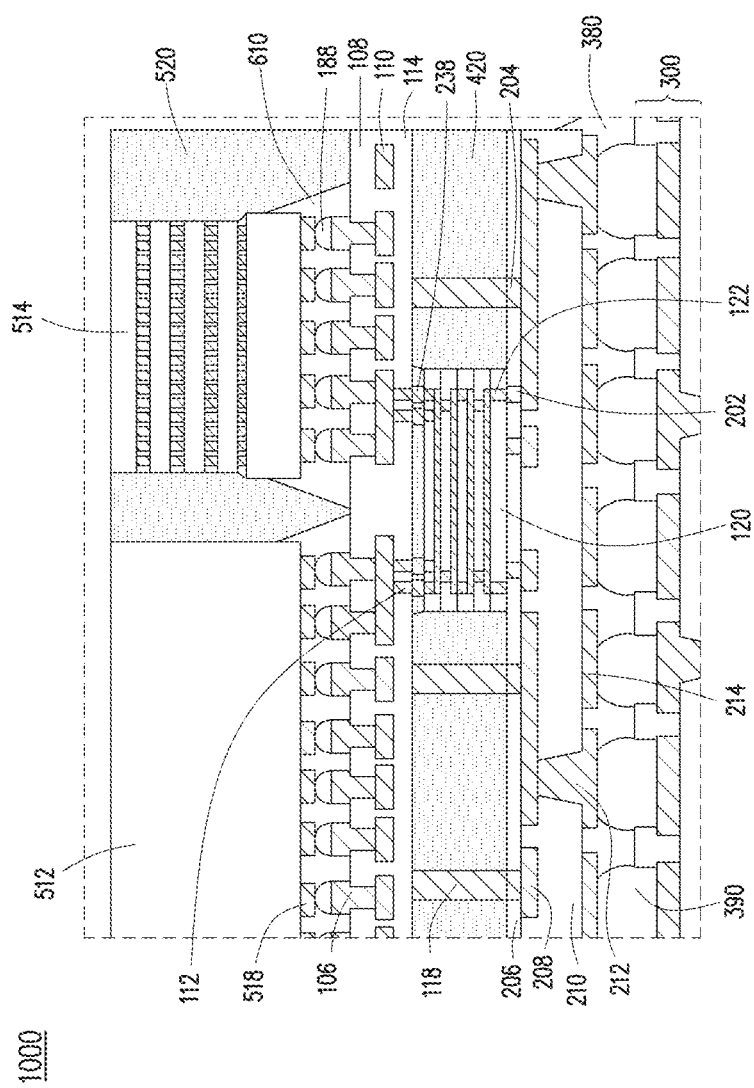
FIG. 2 illustrates a detailed view of a portion of the cross-sectional view of FIG. 1 in accordance with some embodiments.

FIG. 1 illustrates a cross-sectional view of a singulated package component 100 in accordance with some embodiments. FIG. 2 illustrates a detailed view of region 1000 of the cross-sectional view of FIG. 1, in accordance with some embodiments. The singulated package component 100 includes a semiconductor device (e.g., an integrated circuit package 500), a redistribution structure 200 having one or more redistribution layers, a core substrate 300, and external connectors 620, among other elements. The integrated circuit package 500 may include one or more dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the semiconductor device may be an integrated circuit die.

The integrated circuit package 500 may include a plurality of integrated circuit dies. As shown, the integrated circuit package 500 includes one or more logic dies 512, one or more memory dies 514, and one or more input/output (I/O) dies 516 (not shown in FIG. 1, but see FIGS. 5A and 5B) for illustrative purposes. The integrated circuit dies may be formed in one or more wafers, which may include different device regions that are singulated in subsequent steps. The integrated circuit dies may be packaged with other similar or different integrated circuit dies using known manufacturing techniques.

In some embodiments, one or more of the integrated circuit dies 512, 514, and 516 may be stacked devices that include multiple semiconductor substrates. For example, the memory die 514 may be a memory device such as a hybrid memory cube (HMC) module, a high bandwidth memory (HBM) module, or the like that includes multiple memory dies. In such embodiments, the memory die 514 includes multiple semiconductor substrates interconnected by through-substrate vias (TSVs). Each of the semiconductor substrates may (or may not) have an interconnect structure. An encapsulant 520 may surround the integrated circuit dies 512, 514, and 516.

The dies 512, 514, and 516 have bond pads 518 that are bonded to the conductive connectors 188. In some embodiments, the bond pads 518 are made of a conductive material and may be similar to the conductive lines (see, e.g., conductive lines 110) described below.

Conductive connectors 188 provide electrical connection between the redistribution structure 200 and the integrated circuit package 500. An underfill 610 may be included to securely bond the integrated circuit package 500 to the redistribution structure 200 and provide structural support and environmental protection.

As discussed in greater detail below, the redistribution structure 200 provides electrical pathing and connection between the integrated circuit package 500 and a core substrate 300 by way of conductive connectors 390. In some embodiments, the redistribution structure 200 has one or more redistribution layers comprising metallization patterns, comprising, for example, conductive lines 110 and conductive vias 106 and 112, and dielectric layers 108 and 114 on top and bottom sides of the conductive lines 110.

As discussed in greater detail below, the redistribution structure 200 includes one or more local interconnect components 120. The local interconnect components 120 provide electrical routing and connection between the integrated circuit dies 512, 514, and 516 of the integrated circuit package 500 and may be referred to as interconnecting dies 120 or local interconnect structures 120. The local interconnect components 120 increase the communication bandwidth between the integrated circuit dies 512-516 while maintaining low contact resistance and high reliability. The low contact resistance and high reliability is at least in part due to a solder-free connection between the embedded local interconnect component and the redistribution structure. As illustrated in FIGS. 1 and 2, the local interconnect components 120 are connected to conductive vias 112 of the redistribution structure 200 by conductive connectors 238 that may be metal pillars such as e.g. copper pillars.

Due to the increased communication bandwidth between the integrated circuit dies provided by the local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

The local interconnect components 120 are further electrically connected on their bottom sides to the core substrate 300 by way of conductive connectors 390. This double-sided connection of the integrated circuit dies 512, 514, and 516 to the core substrate 300 may provide high bandwidth communication with lower resistance, which may enable increasing signal and power integrity.

As discussed in greater detail below, the local interconnect components 120 may be encapsulated by an encapsulant 420 which may be formed of a molding compound, epoxy, or the like, and may be applied by compression molding, transfer molding, or the like. Through vias 118 may extend through the encapsulant 420 adjacent to the local interconnect components 120 and may be electrically coupled to the conductive lines 110 by conductive vias (not illustrated) extending through the dielectric layer 114.

As discussed in greater detail below, the local interconnect components 120, through vias 118, and encapsulant 420 may be disposed on one or more redistribution layers comprising metallization patterns, comprising, for example, conductive lines 208 and conductive vias 202, 204, and 212, and dielectric layers 206 and 210 on top and bottom sides of the conductive lines 208. The through vias 118 may be physically and electrically coupled on bottom sides to the conductive vias 204. Conductive connectors 122 such as metal pillars, e.g. copper pillars, on the bottom side of the local interconnect components 120 may be bonded to the conductive vias 202 by metal-to-metal bonding such as e.g. copper-to-copper bonding. In some embodiments, the local interconnect components 120 are bonded to the conductive vias 202 and the dielectric layer 206 by hybrid bonding.

The conductive vias 202 and 204 may be electrically coupled to the conductive lines 208, which may be electrically coupled to conductive vias 212 extending to a bottom surface of the dielectric layer 210. Conductive pads 214 on a bottom side of the redistribution structure 200 may be electrically coupled to the conductive vias 212.

The redistribution structure 200 may be electrically and mechanically attached to the core substrate 300. The core substrate 300 may include a central core 310, with conductive vias 320 extending through the central core 310, and additional optional redistribution structures 340 along opposing sides of the central core 310. Generally, the core substrate 300 provides structural support for the component package, as well as providing electrical signal routing between the integrated circuit package and the external connectors 620, which may be physically and electrically coupled to the conductive pads 214.

Underfill 380 may be included between the redistribution structure 200 and the core substrate 300 to securely bond the associated elements and provide structural support and environmental protection.

Figure 3:
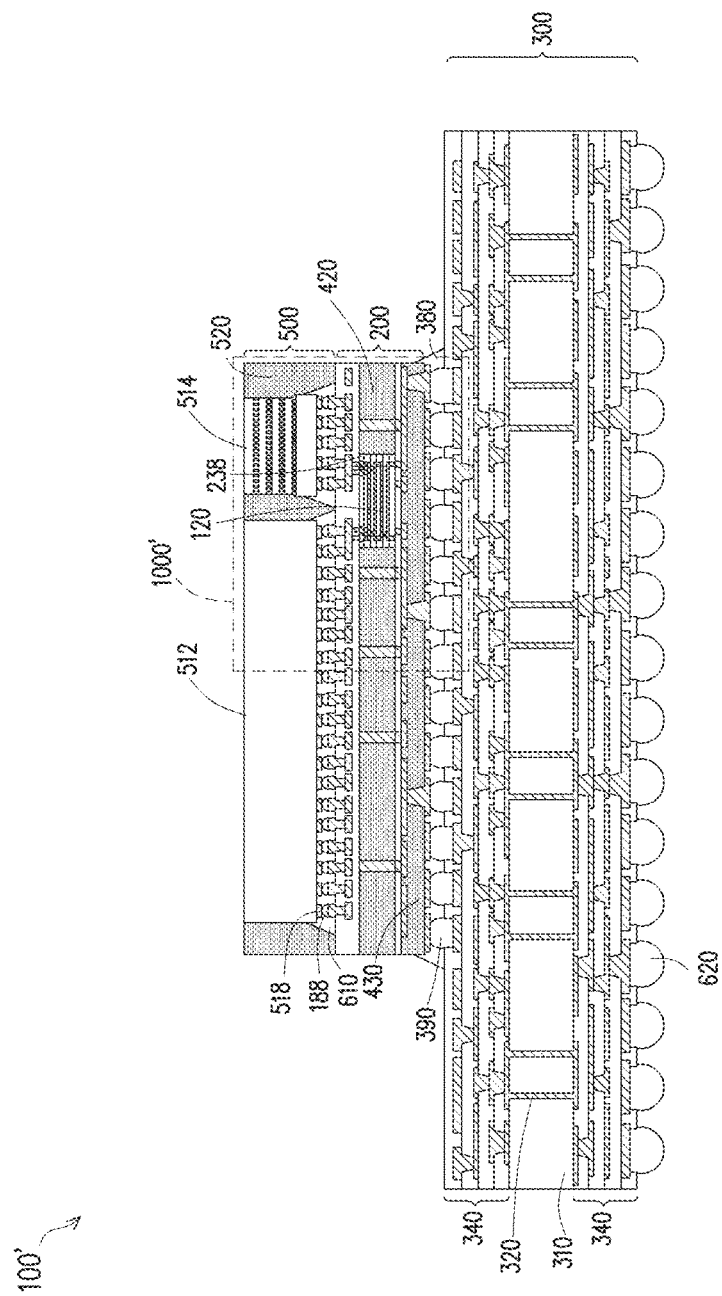
FIG. 3 illustrates a cross-sectional view of another package component in accordance with some embodiments.
Figure 4:
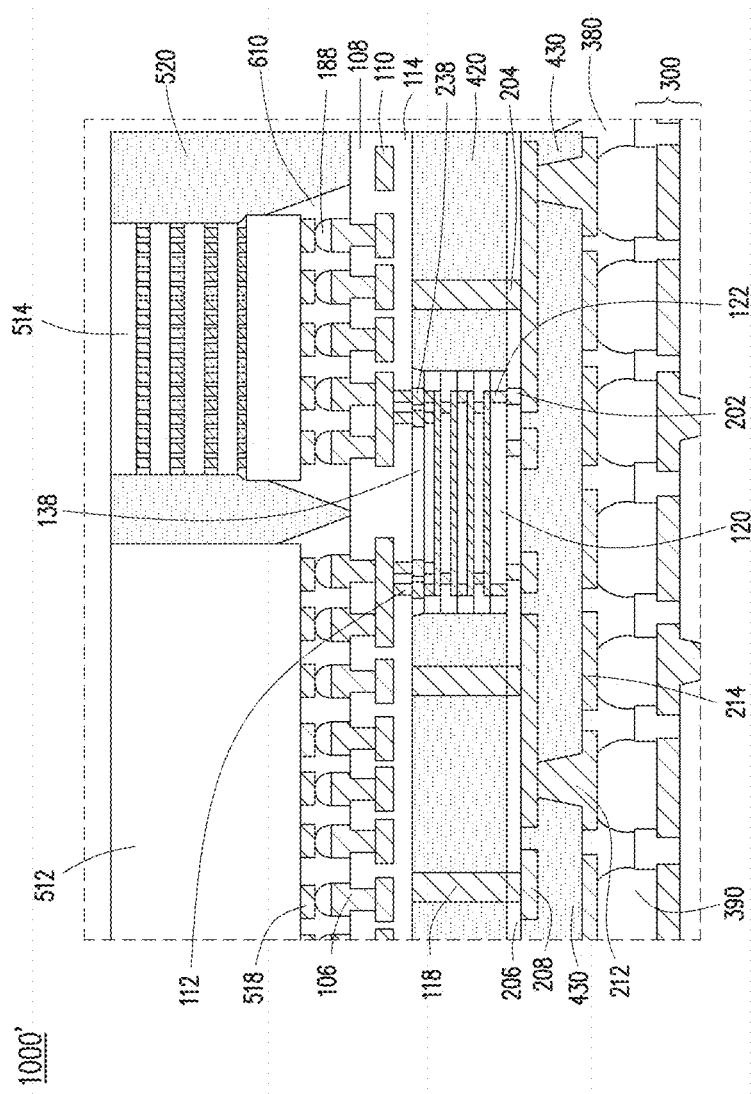
FIG. 4 illustrates a detailed view of a portion of the cross-sectional view of FIG. 3 in accordance with some embodiments.

FIG. 3 illustrates a cross-sectional view of another singulated package component 100' in accordance with some other embodiments. FIG. 4 illustrates a detailed view of region 1000' of the cross-sectional view of FIG. 3, in accordance with some embodiments. The singulated package component 100' as illustrated in FIGS. 3 and 4 is similar to the singulated package component 100 illustrated in FIGS. 1 and 2, except with an underfill 138 around the conductive connectors 238 between the local interconnect 120 and the dielectric layer 114, as discussed in greater detail below (see FIGS. 15C and 15D). The material of the underfill 138 may be a liquid epoxy, deformable gel, silicon rubber, a combination thereof. The underfill 138 and the encapsulant 420 are made of different materials. In some embodiments, the dielectric layer 210 (see above, FIGS. 1 and 2) may be replaced with an encapsulant 430, which may be formed with the same materials as the encapsulant 420 (see above, FIGS. 1 and 2).

Figure 5A:
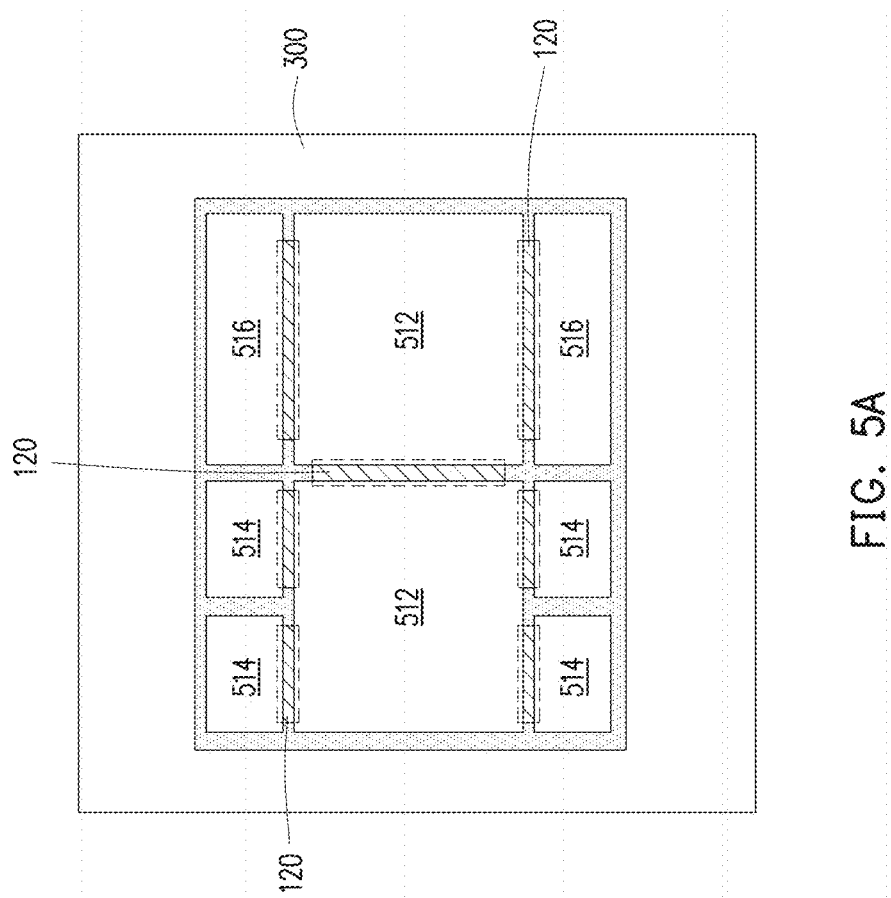
FIGS. 5A and 5B illustrates plan views of package components in accordance with some embodiments.
Figure 5B:
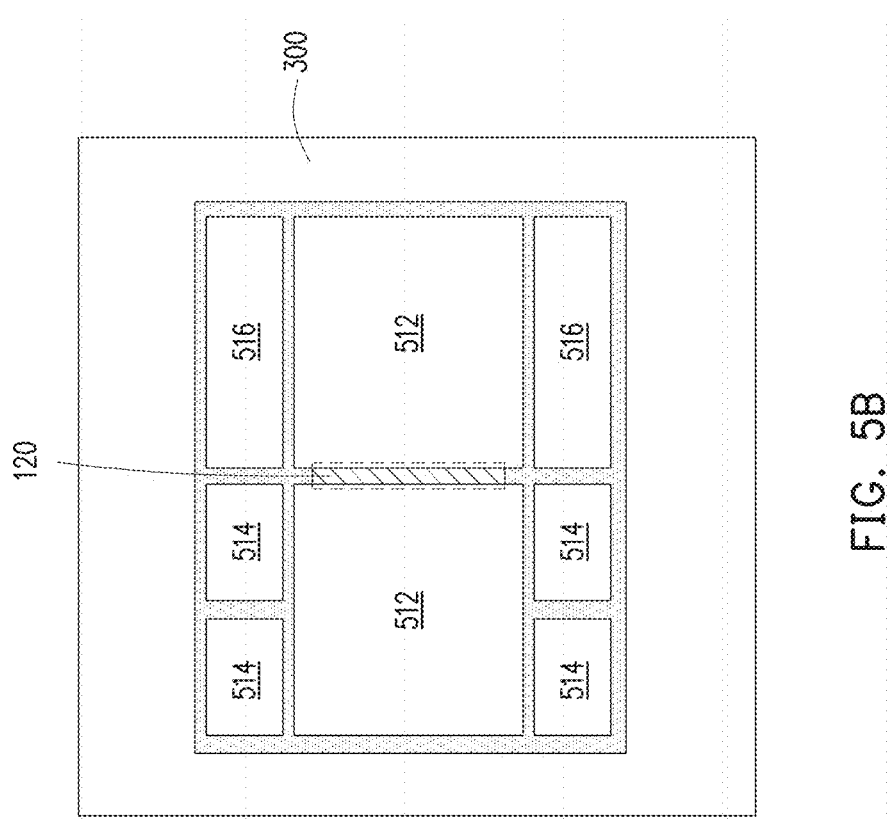

FIGS. 5A and 5B illustrate plan views of the package component in accordance with some embodiments. The embodiment illustrated in FIG. 5A includes two logic dies 512, four memory dies 514, two I/O dies 516, and seven local interconnect components 120. In this embodiment, a first logic die 512 is connected to a first memory die 514 through a first local interconnect component 120 (see above, FIGS. 1-4), the first logic die 512 is connected to a second memory die 514 through a second local interconnect component 120, the first logic die 512 is connected to a third memory die 514 through a third local interconnect component 120, and the first logic die 512 is connected to a fourth memory die 514 through a fourth local interconnect component 120. A second logic die 512 is connected to a first I/O die 516 through a fifth local interconnect component 120 and the second logic die 512 is connected to a second I/O die 516 through a sixth local interconnect component 120. In addition, the first logic die 512 and the second logic die 512 are connected together by a seventh local interconnect component 120.

The embodiment illustrated in FIG. 5B includes two logic dies 512, four memory dies 514, two I/O dies 516, and one local interconnect component 120. In this embodiment, the first logic die 512 and the second logic die 512 are connected to each other by a single local interconnect component 120, and the other dies are connected to each other through redistribution layers in the redistribution structure 200. Other embodiments may include more or less logic dies 512, memory dies 514, I/O dies 516, and local interconnect components 120. In some embodiments, each of the integrated circuit dies are connected to each adjacent integrated circuit die by a local interconnect component.

FIGS. 6 through 10 illustrates various intermediate stages in fabricating a local interconnect component (see FIG. 10), in accordance with some embodiments. The illustrations of the individual features have been simplified in FIGS. 4 through 16 for ease of illustration.

Figure 6:
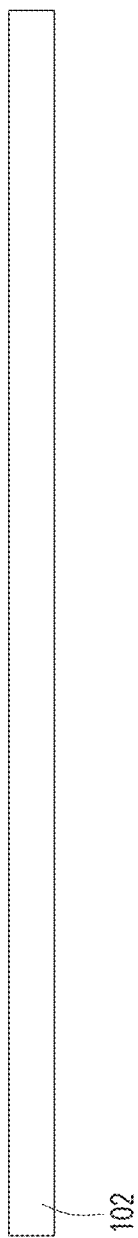
FIGS. 6 through 12 illustrate cross-sectional views of intermediate steps during a process for forming a local interconnect component in accordance with some embodiments.

Referring first to FIG. 6, a carrier substrate 102 is provided, the carrier substrate 102 may be a glass carrier substrate, a ceramic carrier substrate, a semiconductor substrate, such as a bulk semiconductor, or the like. The carrier substrate 102 may be a wafer, such that multiple redistribution structures can be formed on the carrier substrate 102 simultaneously. The carrier substrate 102 may comprise silicon, doped or undoped, or an active layer of a semiconductor-on-insulator (SOI) substrate. The carrier substrate 102 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the carrier substrate 102 may be made up of a ceramic material, a polymer film, a magnetic material, the like or a combination thereof. Other substrates, such as multi-layered or gradient substrates, may also be used. The carrier substrate 102 has an active surface (e.g., the surface facing upwards in FIG. 6), sometimes called a front side, and an inactive surface (e.g., the surface facing downwards in FIG. 6), sometimes called a back side.

Figure 7:
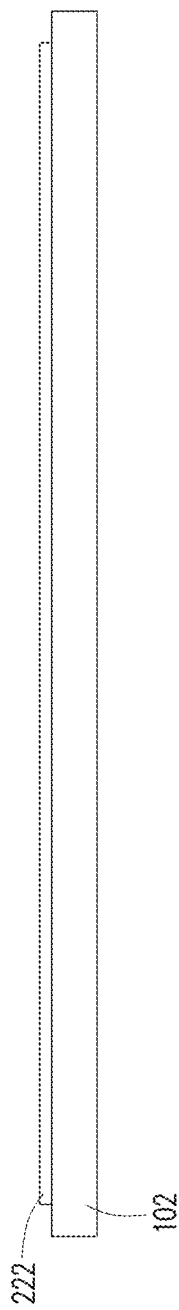

In FIG. 7, a dielectric layer 222 may be formed on the carrier substrate 102. The bottom surface of the dielectric layer 222 may be in contact with the top surface of the carrier substrate 102. In some embodiments, the dielectric layer 222 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 222 may be formed by any acceptable deposition process, such as spin coating, CVD, laminating, the like, or a combination thereof.

Figure 8:
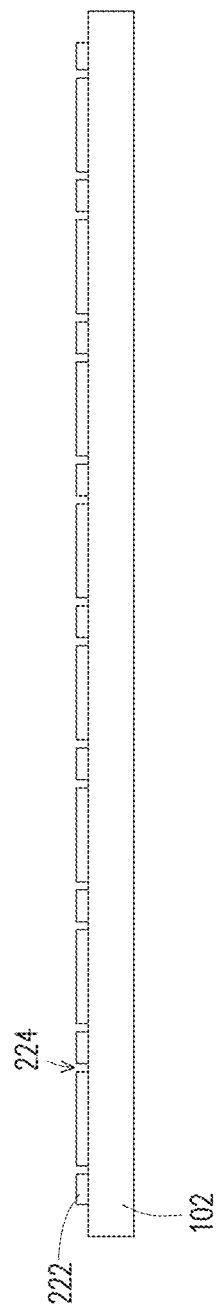

In FIG. 8, the dielectric layer 222 is then patterned to form openings 224 exposing portions of the top surface of the carrier substrate 102. The patterning may be formed by an acceptable process, such as a lithographic process including exposing the dielectric layer 222 to light when the dielectric layer 222 is a photo-sensitive material or by etching using, for example, an anisotropic etch. If the dielectric layer 222 is a photo-sensitive material, the dielectric layer 222 can be developed after the exposure.

Figure 9:
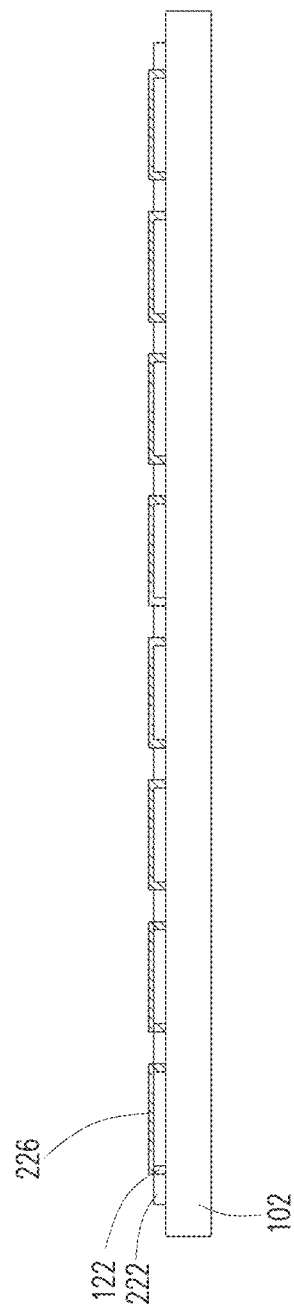

In FIG. 9, a metallization pattern including conductive elements such as conductive lines 226 extending along the major surface of the dielectric layer 222 and conductive vias 122 extending through the dielectric layer 222 to fill the openings 224. As an example to form the metallization pattern, a seed layer is formed over the dielectric layer 222 and in the openings 224 extending through the dielectric layer 22. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive lines 226 of the metallization pattern. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive connectors 122, such as metal pillars e.g. copper pillars, and conductive lines 226 of the metallization pattern. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 10:
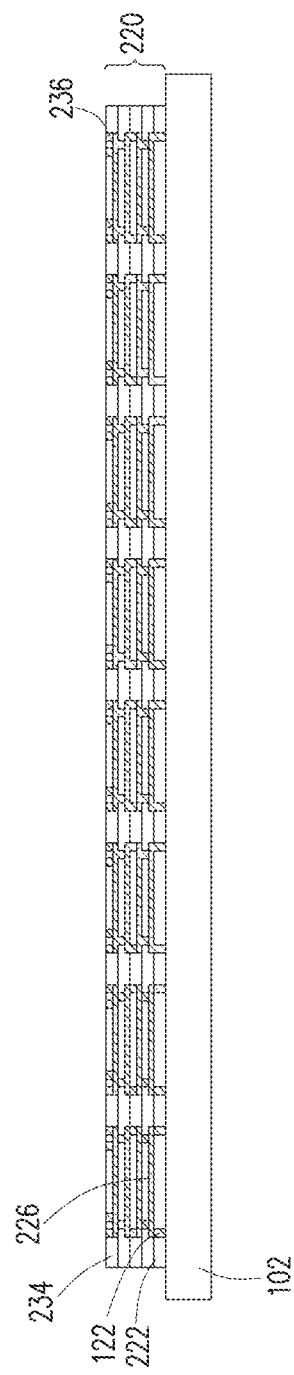

In FIG. 10, a redistribution structure 220 is fabricated by forming additional redistribution layers comprising dielectric layers with embedded metallization patterns comprising conductive lines and vias on the dielectric layer 222 and the conductive lines 226. The conductive lines and vias are arranged so that the local redistribution structure 220 may be subsequently be singulated into local interconnect components (see below, FIGS. 11-12). In the illustrated embodiment, five redistribution layers are formed in the redistribution structure 220, but any suitable number of redistribution layers may be formed, such as two to 10 redistribution layers. The dielectric layers, conductive lines, and vias may be formed using similar methods and materials as the dielectric layer 222, the conductive connectors 122, and the conductive lines 226. The metallization patterns are formed so that conductive vias 236 extending to a top surface of the dielectric layer 234 (on a top surface of the redistribution structure 220) are electrically coupled to neighboring conductive vias 236 and to conductive connectors 122 extending to the bottom side of the redistribution structure 220.

Figure 11:
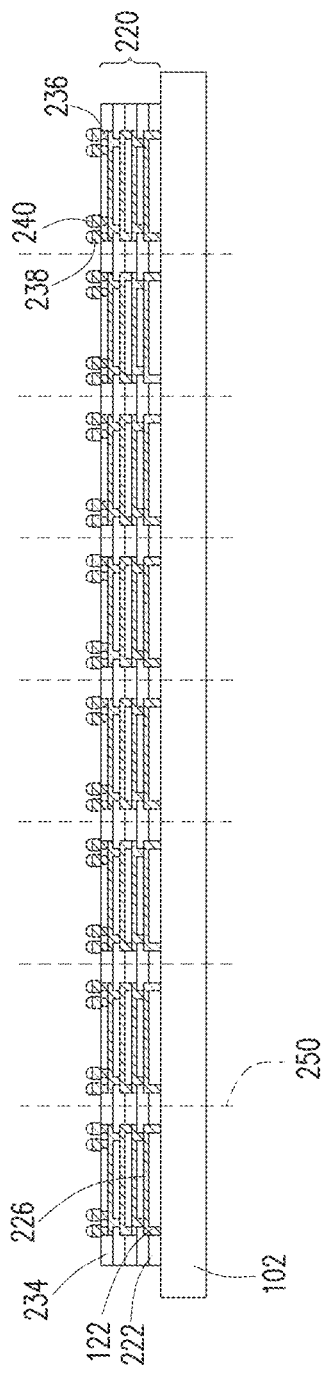

In FIG. 11, conductive connectors 238 are formed for external connection to conductive vias 236. The conductive connectors 238 have bump portions on and extending along the major surface of the dielectric layer 234, and may have via portions extending into the dielectric layer 234 to physically and electrically couple the conductive vias 236. As a result, the conductive connectors 238 are electrically coupled to the conductive connectors 122 extending to the bottom side of the redistribution structure 220. The conductive connectors 238 may be formed of the same material as the conductive vias 236. In some embodiments, the conductive connectors 238 are metal pillars, e.g. copper pillars, or micro bumps. Neighboring conductive connectors 238 may be separated by a pitch P1 in a range of about 20 μm to about 80 μm.

Still referring to FIG. 11, solder regions 240 are formed on the conductive connectors 238. The solder regions 240 allow for physical and electrical connection to dies or another package structure. The solder regions 240 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The solder regions 240 may include a conductive material such as solder, copper, aluminum, gold, nickel, silver, palladium, tin, the like, or a combination thereof. In some embodiments, the solder regions 240 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the solder regions 240 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Further in FIG. 11, a singulation process is performed by sawing along scribe lines 250. The sawing singulates redistribution structure 220 to form multiple singulated local interconnect components 120 (see below, FIG. 12).

Optionally, the solder regions 240 may be used to perform chip probe (CP) testing on the local interconnect components 120. CP testing may be performed on the local interconnect component 120 to ascertain whether the local interconnect component 120 is a known good die (KGD). Thus, only local interconnect components 120, which are KGDs, undergo subsequent processing are packaged, and dies, which fail the CP testing, are not packaged. After testing, the solder regions 240 may be removed in subsequent processing steps (see below, FIG. 19).

Figure 12:
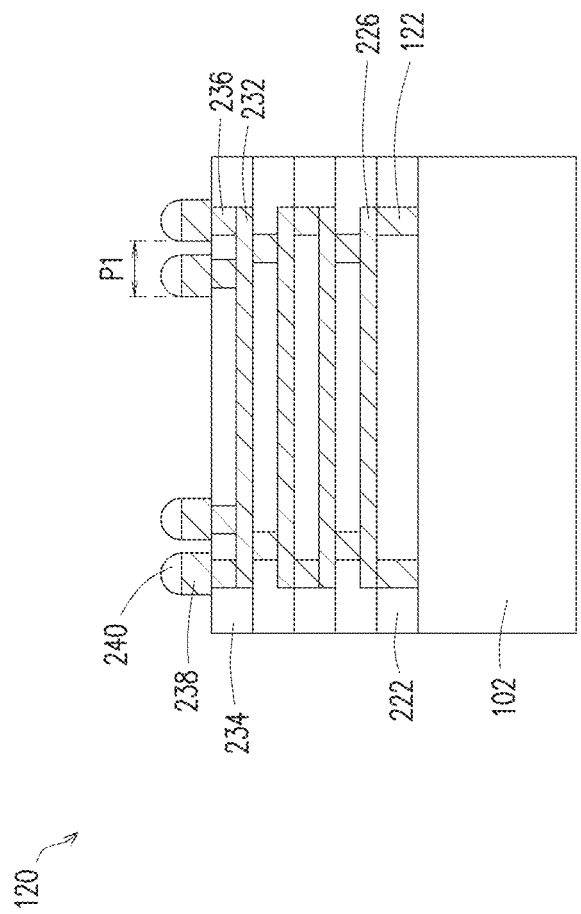

FIG. 12 illustrates a singulated local interconnect component 120. In the illustrated embodiment, the local interconnect component 120 has five redistribution layers. In other embodiments, local interconnect components 120 may have two to 10 redistribution layers. The first redistribution layer of the illustrated local interconnect component 120, comprising the dielectric layer 222 and conductive connectors 122, is on a top surface of a remaining portion of the carrier substrate 102. Conductive connectors 122 extend through the dielectric layer 222 to the top surface of the remaining portion of the carrier substrate 102 and are electrically coupled to conductive lines 226. The conductive connectors 122 may subsequently be used to couple to other components such as core substrates 300 (see above, FIGS. 1 and 2). The conductive lines 226 are coupled through intermediate conductive features such as additional conductive vias and lines to conductive lines 232 in a top redistribution layers of the local interconnect component 120. The conductive lines 232 may be coupled through conductive vias 236 to conductive connectors 238 and solder regions 240, which may be subsequently used to couple integrated circuit dies 512, 514, and 516 to each other and to other components such as a core substrate 300 (see above, FIGS. 1 and 2). The double-sided connection of the integrated circuit dies 512, 514, and 516 to each other and to the core substrate 300 through the local interconnect component 120 may increase the communication bandwidth between the integrated circuit dies while maintaining low contact resistance and high reliability, which may achieve high signal integrity and power integrity, and may enable power distribution networks to be managed through the two-sided connection without a significant voltage drop.

In some embodiments, the local interconnect component 120 has a horizontal width in a range of about 2 mm to about 50 mm, and a horizontal length in a range of about 3 mm to about 80 mm.

FIGS. 13 through 24 illustrates various intermediate stages in fabricating a redistribution structure 200 (see FIG. 23), in accordance with some embodiments. A first package region 101A and a second package region 101B are illustrated where each package region is eventually singulated from other package regions. The illustrations of the individual features have been simplified in FIGS. 13 through 24 for ease of illustration.

Figure 13:
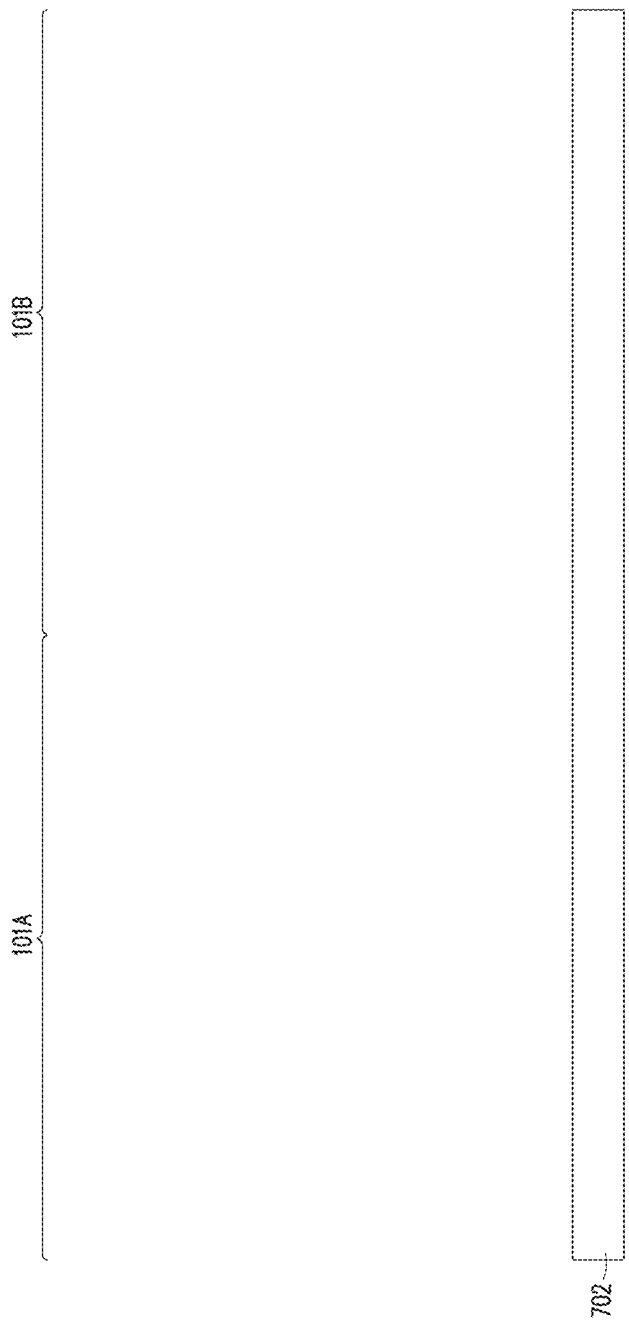
FIGS. 13 through 20 and 23 through 24 illustrate cross-sectional views of intermediate steps during a process for forming a package component in accordance with some embodiments.

Referring first to FIG. 13, a carrier substrate 702 is provided. The carrier substrate 702 may be a glass carrier substrate, a ceramic carrier substrate, or the like. The carrier substrate 702 may be a wafer, such that multiple redistribution structures can be formed on the carrier substrate 702 simultaneously. The carrier substrate 702 may have a release layer (not illustrated) over its top surface. The release layer may be formed of a polymer-based material, which may be removed along with the carrier substrate 702 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 702, or may be the like. The top surface of the release layer may be leveled and be planar within process variations.

Figure 14:
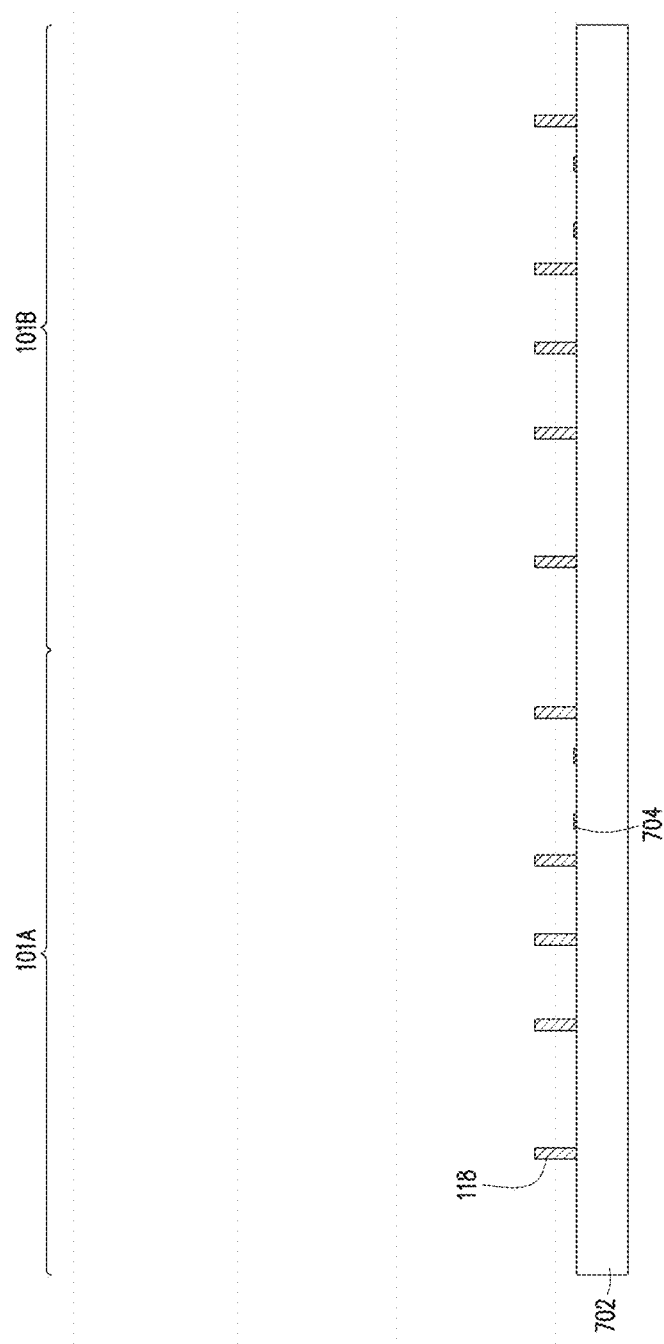

In FIG. 14, a metallization pattern may be formed on the carrier substrate 702. As an example to form the metallization pattern, a seed layer is formed over the carrier substrate 702. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern to be formed. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern.

Still referring to FIG. 14, through vias 118 are formed on portions of the metallization pattern. As an example to form the through vias 118, a photoresist is formed and patterned on the metallization pattern. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the metallization pattern, forming the through vias 118. The conductive material may be formed by plating, such as electroplating or electroless plating, or the like. The conductive material may comprise a metal, like copper, titanium, tungsten, aluminum, or the like. The photoresist is removed, such as by an acceptable ashing or stripping process, such as using an oxygen plasma or the like. Remaining portions 704, also referred to as pads 704, of the metallization pattern upon which through vias 118 are not formed may subsequently be used for attaching local interconnect components 120 (see below, FIGS. 15A-B).

Figure 15B:
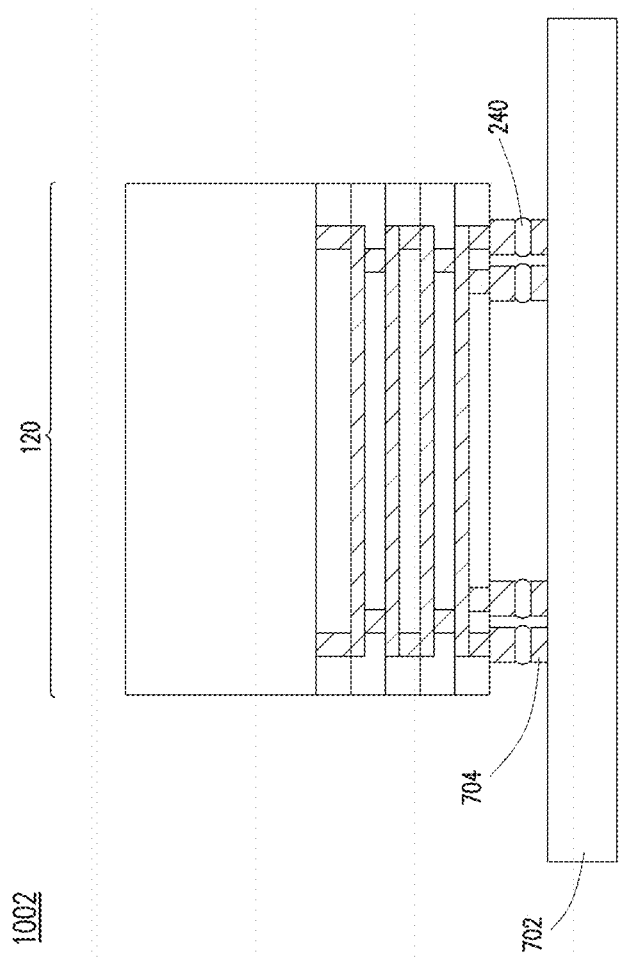

In FIGS. 15A and 15B, the local interconnect components 120 are bonded to the pads 704 on the carrier substrate 702. FIG. 15B illustrates a detailed view of region 1002 of FIG. 15A. In some embodiments, the local interconnect components 120 may be placed on the carrier substrate 702 using a pick and place process or another suitable process and the solder regions 240 bonded by flip chip bonding process or other suitable bonding process. In some embodiments, the solder regions 240 are reflowed to attach the local interconnect components 120 to the carrier substrate 702 by way of pads 704.

Figure 15C:
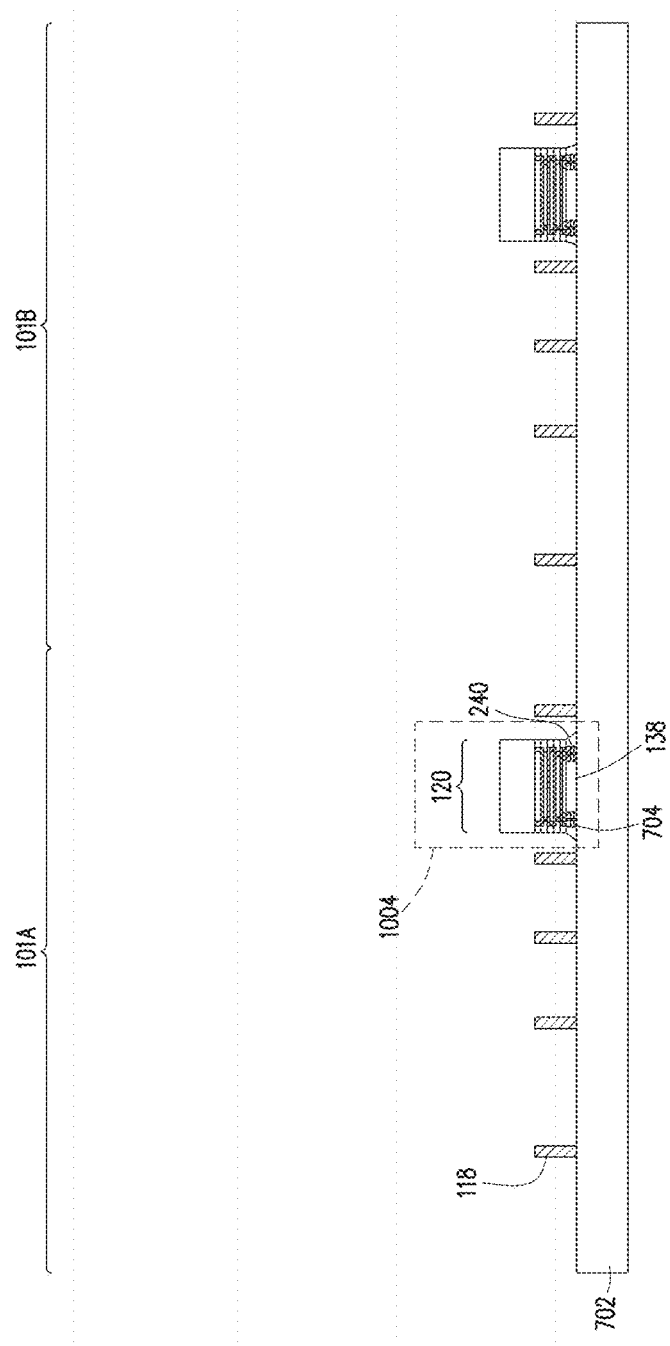
Figure 15D:
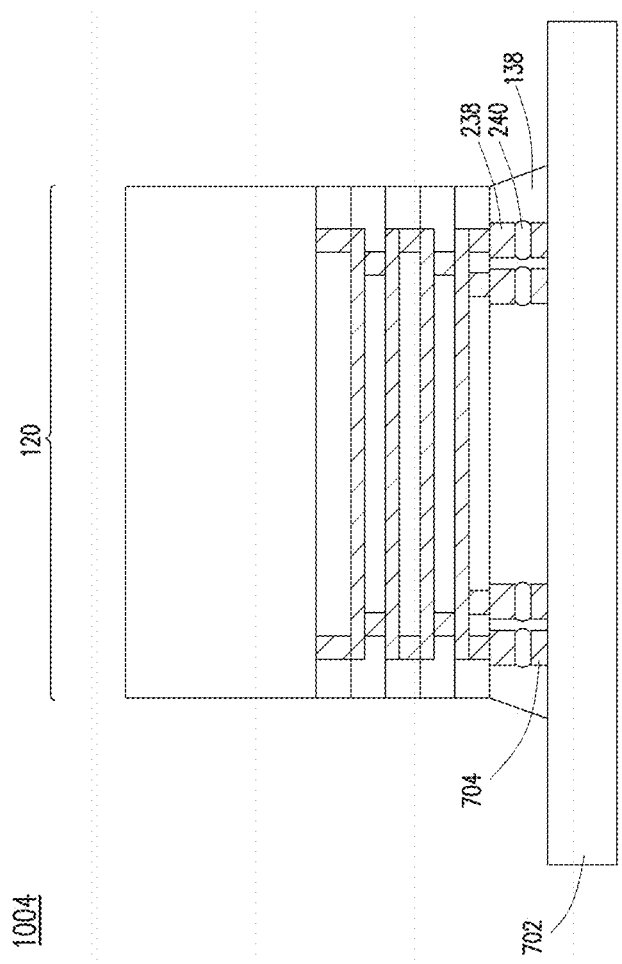

FIGS. 15C and 15D illustrate another embodiment in which an underfill 138 is disposed on a surface of the local interconnect component 120 around the conductive connectors 238. FIG. 15D illustrates a detailed view of region 1004 of FIG. 15C. The underfill 138, also shown in FIGS. 3 and 4, may be formed surrounding the conductive connectors 238 by a capillary flow process or another suitable deposition method between the local interconnect components 120 and the carrier substrate 702. The underfill 138 may reduce stress on the conductive connectors 238. The material of the underfill 138 may be a liquid epoxy, deformable gel, silicon rubber, a combination thereof.

Figure 16:
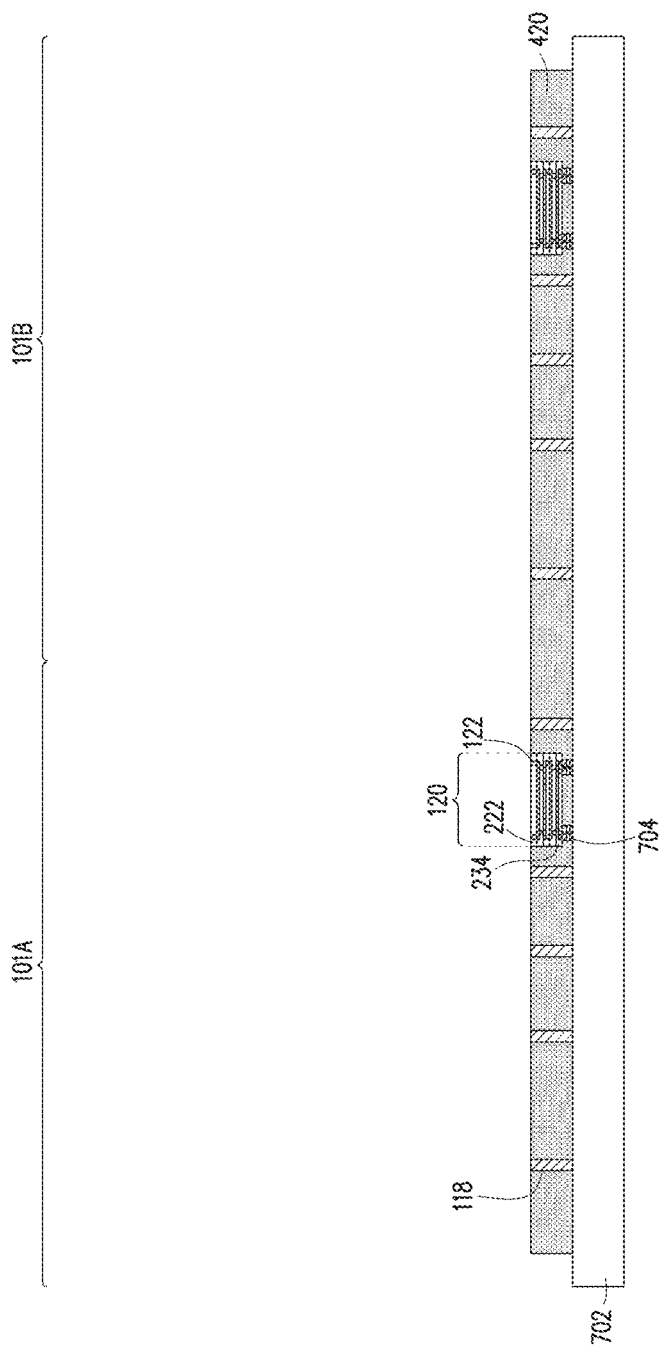

In FIG. 16, an encapsulant 420, also referred to as a dielectric material underfill 420, is formed on and around the through vias 118 and the local interconnect components 120 in accordance with some embodiments. The encapsulant 420 encapsulates the local interconnect components 120 and the through vias 118. In some embodiments, the encapsulant 420 may be formed of pre-preg, Ajinomoto Build-up Film (ABF), resin coated copper (RCC), molding compound, polyimide, photo-imagable dielectric (PID), epoxy, epoxy molding compound, dispense molding underfill, or the like, and may be applied by compression molding, transfer molding, or the like. The encapsulant may be applied in liquid or semi-liquid form and then subsequently cured. In some embodiments, the encapsulant 420 is formed over the carrier substrate 702 such that the through vias 118 and local interconnect components 120 are buried or covered, and a planarization process is then performed to remove a top portion of the encapsulant 420 and the substrates 102 of the local interconnect components 120 to expose the through vias 118 and the conductive connectors 122 of the local interconnect components 120. Topmost surfaces of the encapsulant 420, through vias 118, and the conductive connectors 122 of the local interconnect components 120 are level (e.g., planar) within process variations after the planarization process. The planarization process may be, for example, a grinding or a chemical-mechanical polish (CMP). In some embodiments, the encapsulant 420 may comprise other materials, such as silicon oxide, silicon nitride, or the like. After the planarization process (if any), the vertical thickness of the local interconnect components measured from a bottom surface of dielectric layer 234 to a top surface of dielectric layer 222 may be in a range of about 10 μm to about 100 μm.

The local interconnect components 120 provide electrical connection between the subsequently attached integrated circuit dies (e.g., 512, 514, and 516) and other components such as the core substrate 300. The embedded local interconnect components 120 may increase the communication bandwidth between the integrated circuit dies and the core substrate 300 while maintaining low contact resistance and high reliability. In some embodiments, other components such as an integrated voltage regulator, an integrated passive device, a static random-access-memory, the like, or a combination thereof can also be embedded in a similar manner as the embedded local interconnect component.

Figure 17:
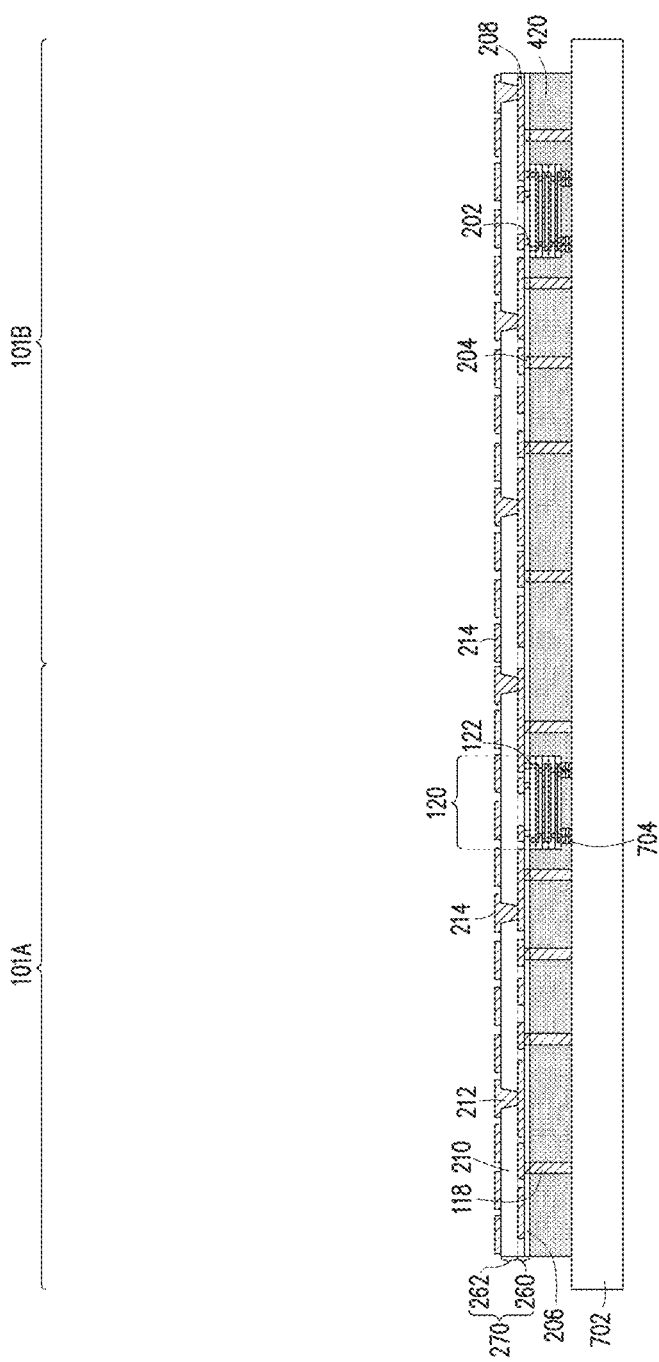

In FIG. 17, a redistribution structure 270, also referred to as a back-side redistribution structure 270 or an interconnect structure 270, comprising redistribution layers 260 and 262 is formed over the encapsulant 420, through vias 118, and local interconnect components 120. Although the embodiments illustrated in accordance with FIG. 17 show the back-side redistribution structure 270 with two redistribution layers, any suitable number of redistribution layers may be formed, such as from one to twenty redistribution layers. The redistribution layers 260 and 262 may be used to couple the through vias 118 and local interconnect components 120 to subsequently attached components such as e.g. core substrates 300 (see above, FIGS. 1 and 2).

The redistribution layer 260 comprises a dielectric layer 206 and conductive vias 202 and 204 extending through the dielectric layer 206 to couple the conductive connectors 122 of the local interconnect components 120 and the through vias 118, respectively. The dielectric layer 206 may be formed on the encapsulant 420, the through vias 118, and the local interconnect components 120. In some embodiments, the dielectric layer 108 is formed of a polymer, such as polybenzoxazole (PBO), polyimide, benzocyclobutene (BCB), or the like. In other embodiments, the dielectric layer 206 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 206 may be formed by any acceptable deposition process, such as spin coating, CVD, laminating, the like, or a combination thereof.

In some embodiments, the conductive vias 202 and 204 are formed with a damascene process in which the dielectric layer 206 is patterned and etched utilizing photolithography techniques to form trenches corresponding to the desired pattern of conductive vias, such as over the through vias 118 and the conductive connectors 122 of the local interconnect components 120. An optional diffusion barrier and/or optional adhesion layer may be deposited and the trenches may be filled with a conductive material. Suitable materials for the barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the conductive vias 202 and 204 may be formed by depositing a seed layer of copper or a copper alloy, and filling the trenches by electroplating. A chemical mechanical planarization (CMP) process or the like may be used to remove excess conductive material from a surface of the dielectric layer 206 and to planarize the surface for subsequent processing.

Still referring to FIG. 17, a redistribution layer 262 is formed on the redistribution layer 260. The redistribution layer 262 comprises conductive features such as a conductive lines 208 and conductive vias 212 embedded in a dielectric layer 210. The conductive lines 208 and conductive vias 212 may couple the conductive vias 202 and 204 to subsequently attached components such as e.g. core substrates 300 (see above, FIGS. 1 and 2).

As an example to form the redistribution layer 262, a seed layer is formed over the dielectric layer 206 and the conductive vias 202 and 204. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive lines 208. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 208. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Still referring to FIG. 17, conductive vias 212 are formed on and extending from the conductive lines 208. As an example to form the conductive vias 212, a photoresist is formed and patterned on the conductive lines 208. The photoresist may be formed by spin coating or the like and may be exposed to light for patterning. The patterning forms openings through the photoresist to expose the conductive lines 208, where the openings in the photoresist correspond to the conductive vias 212. A conductive material is then formed in the openings of the photoresist and on the exposed portions of the conductive lines 208. The conductive material may be formed by plating, such as electroplating or electroless plating, or the like. The conductive material may comprise a metal, like copper, titanium, tungsten, aluminum, or the like. The conductive material forms the conductive vias 212. The photoresist is then removed. The photoresist may be removed by an acceptable ashing or stripping process, such as using an oxygen plasma or the like. In some embodiments, the conductive vias 212 have widths in a range of about 2 µm to about 100 µm, such as about 30 µm.

Further referring to FIG. 17, a dielectric layer 210 is formed on and around the conductive lines 208 and the conductive vias 212 in accordance with some embodiments. After formation, the dielectric layer 210 surrounds the conductive vias 212 and conductive lines 208. The dielectric layer 210 and metallization pattern, including conductive vias 212 and conductive lines 208, form the redistribution layer 262. In some embodiments, the dielectric layer 210 is formed of a polymer, such as polybenzoxazole (PBO), polyimide, benzocyclobutene (BCB), or the like. In other embodiments, the dielectric layer 210 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 210 may be formed by any acceptable deposition process, such as spin coating, CVD, laminating, the like, or a combination thereof. The dielectric material may be applied in liquid or semi-liquid form and then subsequently cured to form the dielectric layer 210. In still other embodiments, the dielectric layer 210 may be replaced by an encapsulant 430 (see above, FIGS. 3 and 4) formed of pre-preg, Ajinomoto Build-up Film (ABF), resin coated copper (RCC), molding compound, polyimide, photo-imagable dielectric (PID), epoxy, epoxy molding compound, or the like, and may be applied by compression molding, transfer molding, or the like.

In some embodiments, the dielectric layer 210 is formed over the dielectric layer 206 such that the conductive lines 208 and conductive vias 212 are buried or covered, and a planarization process is then performed on the dielectric layer 210 to expose the conductive vias 212. Topmost surfaces of the dielectric layer 146 and conductive vias 144 are level (e.g., planar) within process variations after the planarization process. The planarization process may be, for example, a CMP. In some embodiments, the dielectric layer 210 may comprise other materials, such as silicon oxide, silicon nitride, or the like. In some embodiments, the redistribution layers 260 and 262 have a total thickness in a range of about 2 µm to about 50 µm.

Still referring to FIG. 17, conductive pads 214 are formed on the dielectric layer 210 and coupled to the conductive vias 212. External connectors may subsequently be formed on conductive pads 214 to couple to external devices such as e.g. core substrates 300 (see above, FIGS. 1 and 2). The conductive pads may be formed using similar methods and materials as described above with respect to the conductive lines 208.

Figure 18:
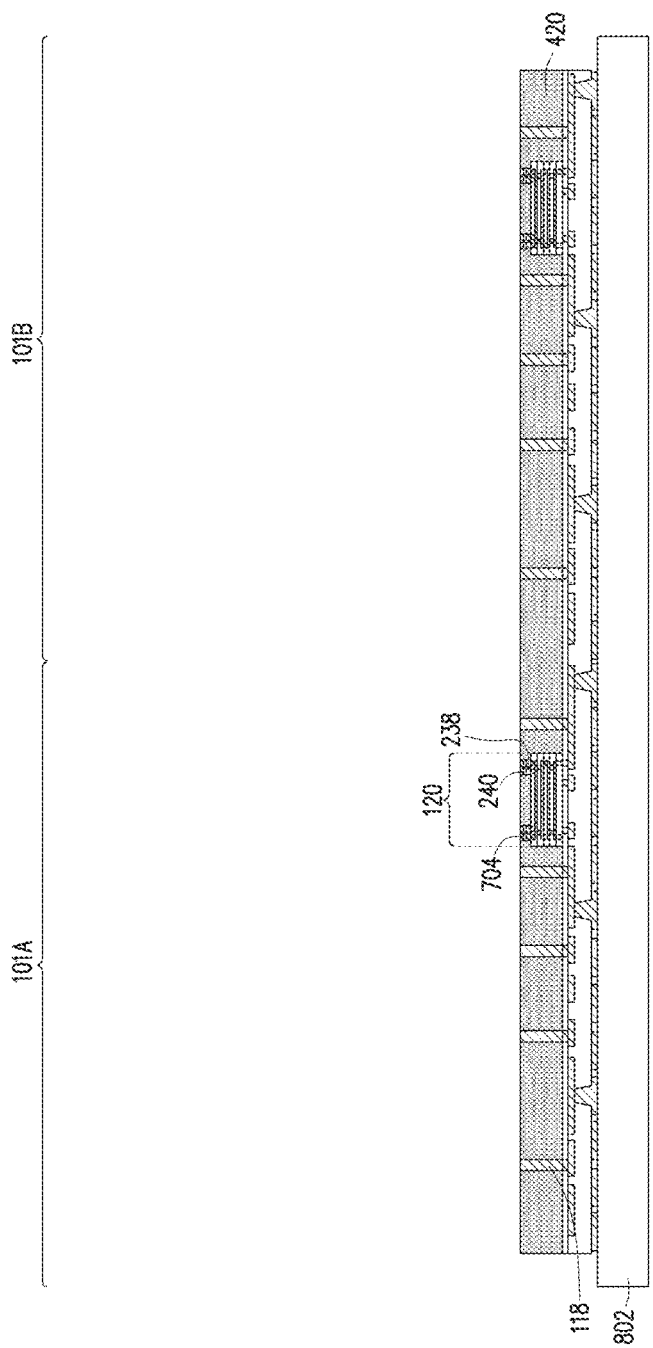

In FIG. 18, a carrier substrate de-bonding is performed to detach (or "de-bond") the carrier substrate 702 from the pads 704, encapsulant 420, and through vias 118. In accordance with some embodiments, the de-bonding includes projecting a light such as a laser light or an UV light on the release layer (not illustrated) over the carrier substrate 702 so that the release layer decomposes under the heat of the light and the carrier substrate 702 can be removed. The structure is then flipped over and placed on another carrier substrate 802 and release layer (not illustrated).

Figure 19:
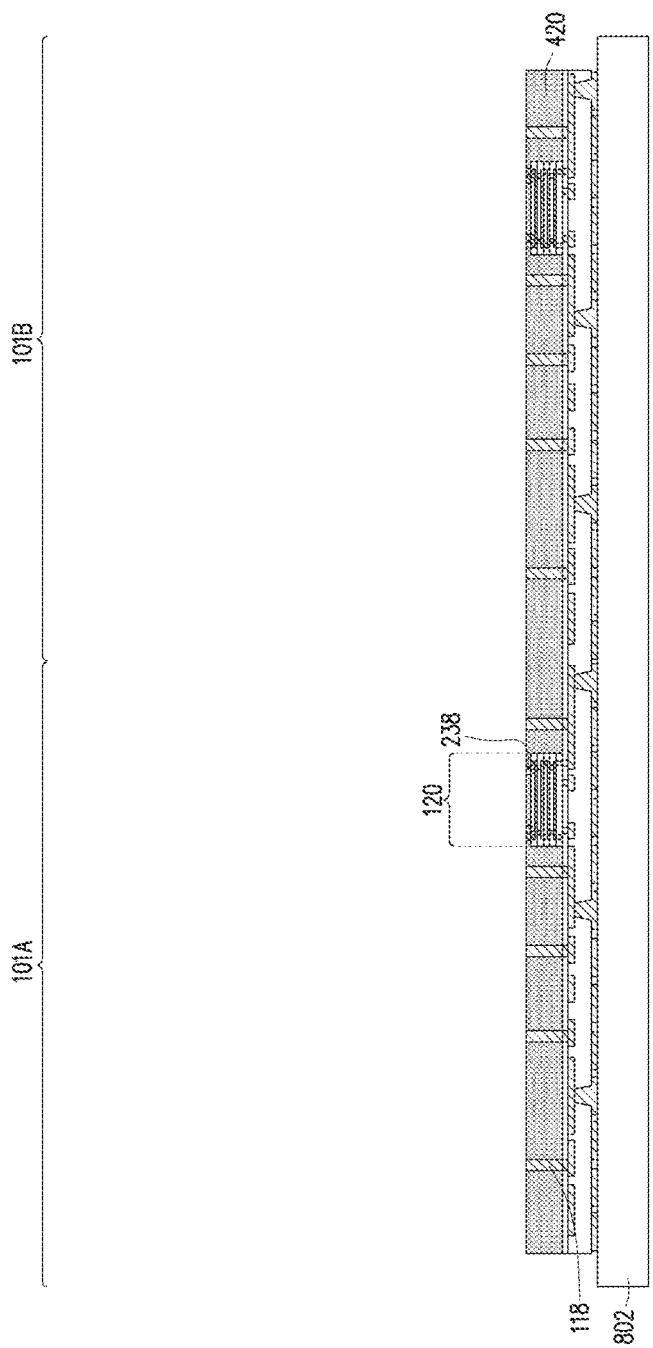

In FIG. 19, a planarization such as a grinding or a chemical mechanical polish is performed to remove the pads 704 and solder regions 240 (see FIG. 18), exposing top surfaces of the conductive connectors 238 of the local interconnect components 120. Top portions of the encapsulant 420 and through vias 118 may also be removed. After the planarization, top surfaces of the conductive connectors 238 may be level with top surfaces of the encapsulant 420 and top surfaces of the through vias 118.

Figure 20:
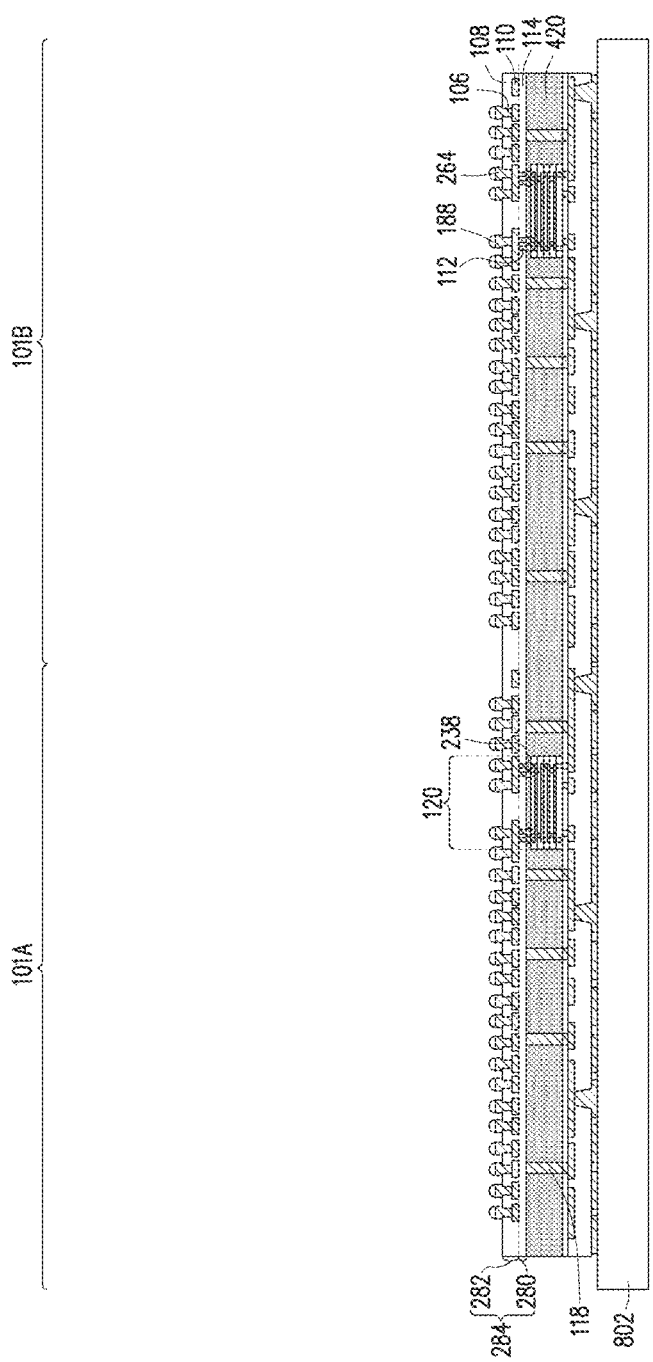

In FIG. 20, an interconnect structure 284, also referred to as a redistribution structure 284, comprising redistribution layers 280 and 282 is formed over the encapsulant 420, through vias 118, and local interconnect components 120. Although the embodiments illustrated in accordance with FIG. 20 show the interconnect structure 284 with two redistribution layers, any suitable number of redistribution layers may be formed, such as from one to ten redistribution layers. The redistribution layers 280 and 282 may be used to couple the through vias 118 and local interconnect components 120 to subsequently attached components such as e.g. integrated circuit dies 512, 514, and 516.

The redistribution layer 280 comprises a dielectric layer 114 and conductive vias 112 and 204 extending through the dielectric layer 114 to couple the conductive connectors 238 of the local interconnect components 120. Additional conductive vias (not illustrated) may extend through the dielectric layer 114 to couple the through vias 118. The dielectric layer 114, conductive vias 112, and additional conductive vias (not illustrated) coupled to the through vias 118 may be formed using similar methods and materials as the dielectric layer 206 and the conductive vias 202 and 204 (see above, FIG. 17). In some embodiments, the conductive vias 112 and additional conductive vias (not illustrated) have widths in a range of about 2 µm to about 50 µm, such as about 10 µm.

Redistribution layer 282 is formed over redistribution layer 280 and comprises a dielectric layer 108 and a metallization pattern comprising conductive lines 110 and conductive vias 106. The conductive lines 110 may be formed on and coupled to the conductive vias 112 and the additional conductive vias (not illustrated) coupled to the through vias 118. The conductive lines 110, conductive vias 106, and dielectric layer 108 may be formed using similar methods and materials as the conductive lines 208, conductive vias 212, and dielectric layer 210 (see FIG. 17). In some embodiments, the redistribution layers 280 and 282 have a total thickness in a range of about 2 µm to about 50 µm.

Still referring to FIG. 20, under-bump metallizations (UBMs) 264 (sometimes referred to as pads 264) are formed for external connection to conductive vias 106. The UBMs 264 have bump portions on and extending along the major surface of the dielectric layer 108, and may have via portions extending into the dielectric layer 108 to physically and electrically couple the conductive vias 106. As a result, the UBMs 264 are electrically coupled to the through vias 118 and the local interconnect components 120. The UBMs 264 may be formed of the same material as the conductive vias 106.

Further referring to FIG. 20, conductive connectors 188 are formed on the UBMs 264. The conductive connectors 188 allow for physical and electrical connection to dies such as e.g. integrated circuit dies 512, 514, and 516 or another package structure. The conductive connectors 188 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 188 may include a conductive material such as solder, copper, aluminum, gold, nickel, silver, palladium, tin, the like, or a combination thereof. In some embodiments, the conductive connectors 188 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 188 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, neighboring conductive connectors are separated by a pitch in a range of about 20 µm to about 80 µm.

Figure 21:
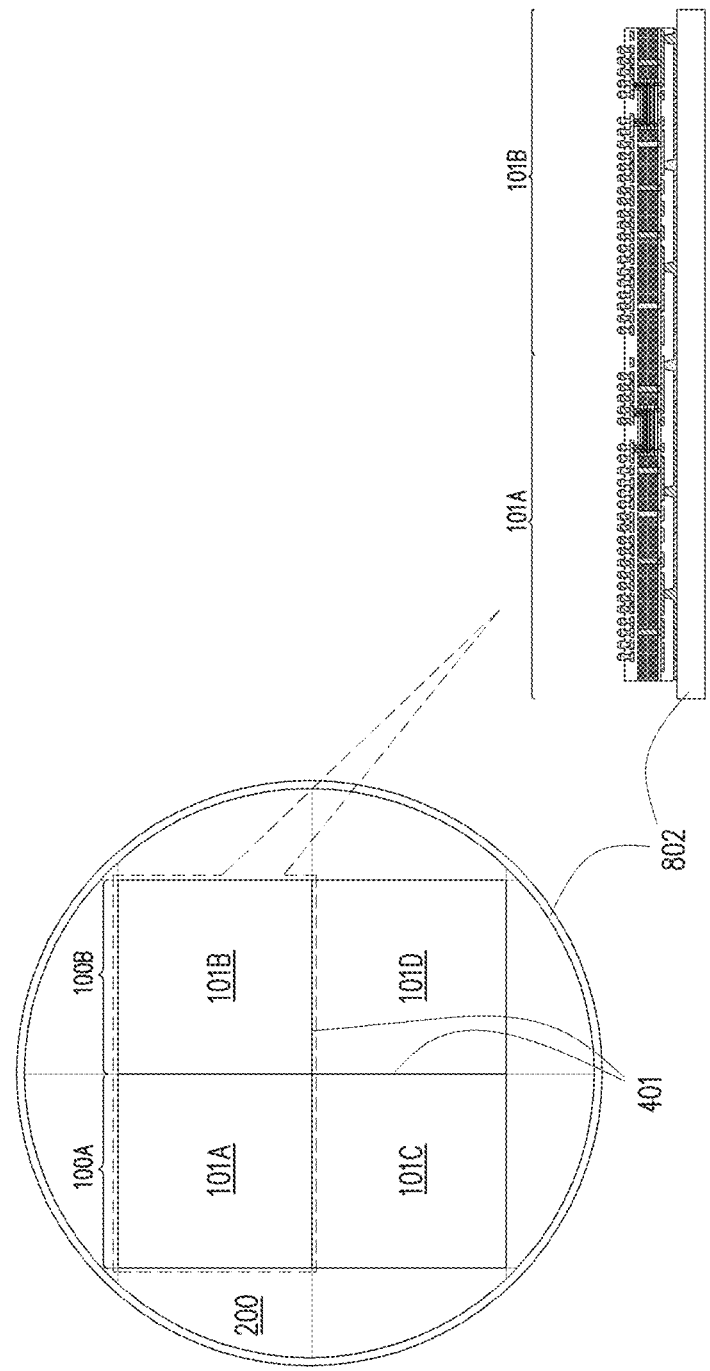
FIG. 21 illustrates a planar view of the layout of package regions on a wafer substrate in accordance with some embodiments.

As discussed above, the redistribution structure 200 may be larger and include multiple package regions, such as the first package region 101A and second package region 101B. For example, FIG. 21 illustrates the redistribution structure 200 as illustrated above in FIG. 20 having a circular wafer shape with multiple package regions. In the embodiment shown, four package regions 101A, 101B, 101C, and 101D are included on the wafer allowing for four final package components to be fabricated on a single wafer and later singulated. Fewer or more package regions may be utilized on a single wafer in other embodiments. Subsequent steps in the process use the redistribution structure 200 on a carrier substrate 802 as the base upon which to continue the fabrication process described in further detail below. As described in further detail below, the individual package regions are singulated by sawing along lines 401 and around the outer edges of package regions 101A, 101B, 101C, and 10D.

Figure 22:
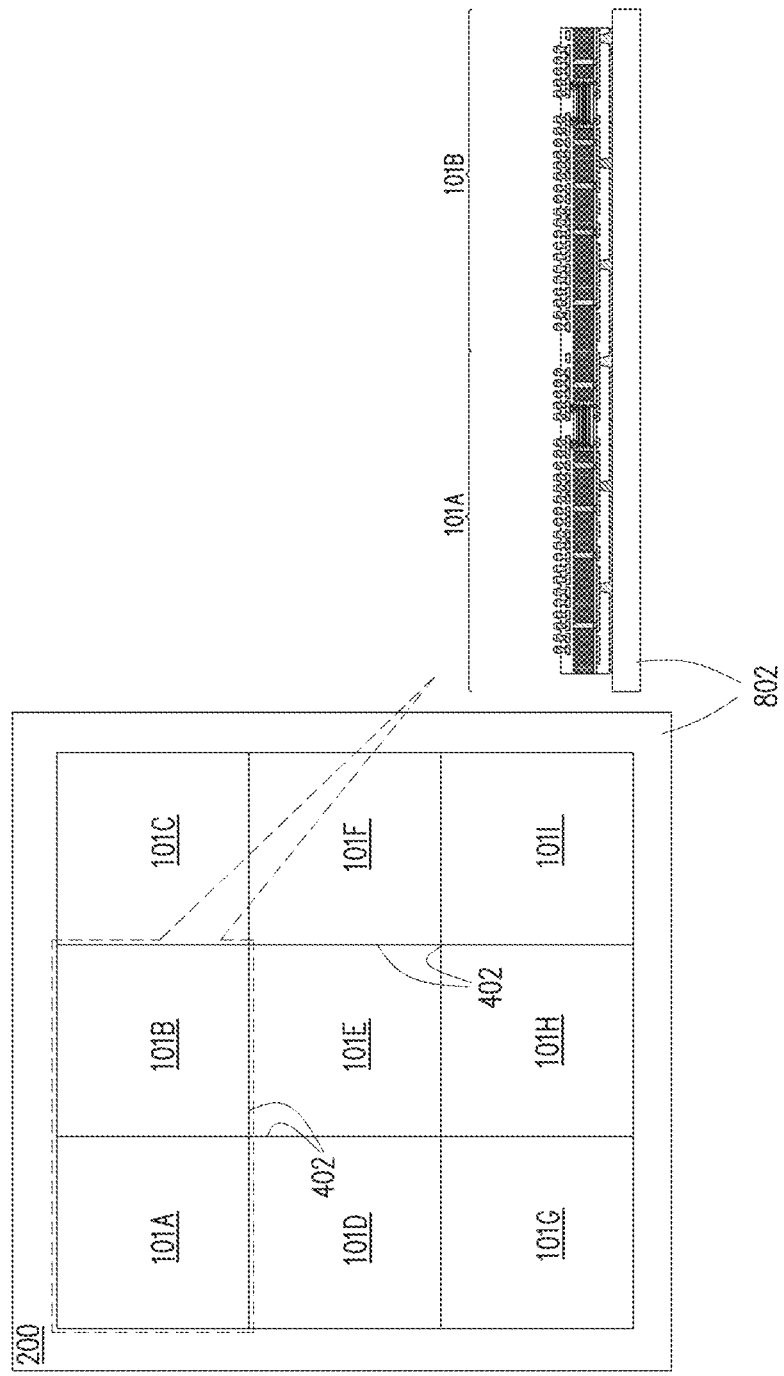
FIG. 22 illustrates a planar view of the layout of package regions on a panel substrate in accordance with some embodiments.

FIG. 22 illustrates the redistribution structure 200 being manufactured using a panel form fabrication process with multiple package regions. In the embodiment shown, nine package regions 101A through loll are included on the wafer allowing for nine final package components to be fabricated on a single wafer or panel. Fewer or more package regions may be utilized on a single wafer or panel in other embodiments. Subsequent steps in the process use the redistribution structure 200 on a carrier substrate 802 as the base upon which to continue the fabrication process described in further detail below. As described in further detail below, the individual package regions are singulated by sawing along lines 402 and around the perimeter of package regions 101A through 101I.

Figure 23:
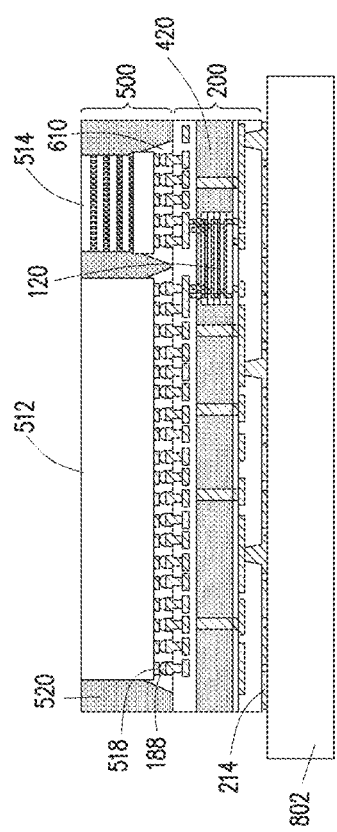

In FIG. 23, a singulation process is performed by sawing along scribe line regions, e.g., between the first package region 101A and the second package region 101B. The sawing singulates the first package region 101A from adjacent package regions to form multiple singulated redistribution structures 200.

Further referring to FIG. 23, an integrated circuit package 500 is attached to the redistribution structure 200. The attachment may be performed before or after singulating individual package regions of the redistribution structure 200. The integrated circuit package 500 may include a plurality of integrated circuit dies such as one or more logic dies 512, one or more memory dies 514, and one or more input/output (I/O) dies 516 (not shown in FIG. 23, but see FIGS. 5A and 5B) for illustrative purposes. The dies 512, 514, and 516 have bond pads 518 that are bonded to the conductive connectors 188. In some embodiments, the bond pads 518 are made of a conductive material and may be similar to the conductive lines (see, e.g., conductive lines 110) described above. In some embodiments, the dies 512, 514, and 516 may be placed on the redistribution structure 200 using a pick and place process or another suitable process and the conductive connectors 188 bonded by flip chip bonding process or other suitable bonding process. In some embodiments, the conductive connectors 188 are reflowed to attach the dies 512, 514, and 516 to the redistribution structure 200 by way of the bond pads 518. The dies 512, 514, and 516 may be coupled to the redistribution structure 200 such that neighboring dies 512, 514, and 516 are coupled to each other through local interconnect components 120 (see above, FIGS. 5A and 5B). The local interconnect components 120 provide electrical routing and connection between the integrated circuit dies 512, 514, and 516 of the integrated circuit package 500 and increase the communication bandwidth between the integrated circuit dies 512-516 while maintaining low contact resistance and high reliability.

In some embodiments, an underfill 610, as shown in FIG. 1, is formed surrounding the conductive connectors 188 between the integrated circuit package 500 and the redistribution structure 200. The underfill 610 may reduce stress and protect the joints resulting from the reflowing of the conductive connectors 188. The underfill 610 may be formed by a capillary flow process after the integrated circuit package 500 is attached, or may be formed by a suitable deposition method. In some embodiments, a single layer of underfill 610 is formed beneath multiple adjacent devices, and further subsequent underfills (not shown) or encapsulants (not shown) may be formed beneath and/or around additional devices placed on top of the singulated package component 100 (see below, FIG. 24).

In some embodiments, an encapsulant 520 may be formed around the integrated circuit dies 512, 514, and 516. The encapsulant 520 may be formed of a molding compound, epoxy, or the like, and may be applied by compression molding, transfer molding, or the like. The encapsulant 520 may be applied in liquid or semi-liquid form and then subsequently cured. The encapsulant 520 may be formed over the structure such that integrated circuit dies 512, 514, and 516 are buried or covered.

Figure 24:
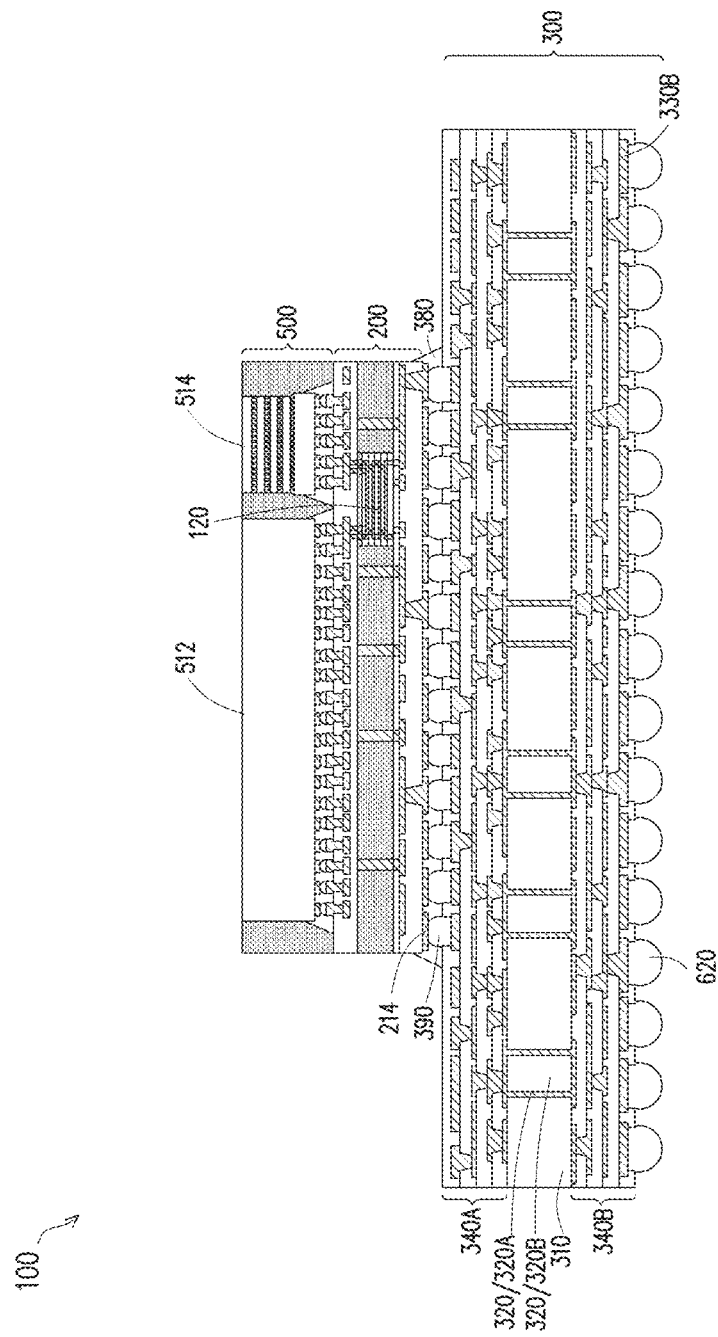

FIG. 24 illustrates a singulated package component 100 formed by attaching the integrated circuit package 500 and redistribution structure 200 to another package, such as e.g. a core substrate 300. A carrier substrate de-bonding is performed to detach (or "de-bond") the carrier substrate 802 from the integrated circuit package 500 and redistribution structure 200. In accordance with some embodiments, the de-bonding includes projecting a light such as a laser light or an UV light on the release layer (not illustrated) over the carrier substrate 802 so that the release layer decomposes under the heat of the light and the carrier substrate 802 can be removed. The structure is then flipped over and placed on another carrier, such as a tape (not illustrated).

Still referring to FIG. 24, a core substrate 300 is illustrated and bonded the redistribution structure 200. Utilizing the core substrate 300 has the advantage of having the core substrate 300 being manufactured in a separate process. In addition, because core substrate 300 is formed in a separate process, it can be tested separately so that a known good core substrate 300 is used. For example, in some embodiments, the core substrate 300 may be individually or batch tested, validated, and/or verified prior to bonding the core substrate 300 to the redistribution structure 200.

The core substrate 300 may be, e.g., an organic substrate, a ceramic substrate, a silicon substrate, or the like. The conductive connectors 390 are used to attach the core substrate 300 to the redistribution structure 200. Attaching the core substrate 300 may include placing the core substrate 300 on the redistribution structure 200 and reflowing the conductive connectors 390 to physically and electrically couple the core substrate 300 and the redistribution structure 200.

Before being attached to the redistribution structure 200, the core substrate 300 may be processed according to applicable manufacturing processes to form redistribution structures in the core substrate 300. For example, the core substrate 300 includes a core 310. The core 310 may be formed of one or more layers of glass fiber, resin, filler, pre-preg, epoxy, silica filler, Ajinomoto Build-up Film (ABF), polyimide, molding compound, other materials, and/or combinations thereof. In some embodiments, for example, two layers are of material make up the core 310. The core 310 may be formed of organic and/or inorganic materials. In some embodiments, the core 310 includes one or more passive components (not shown) embedded inside. The core 310 may comprise other materials or components.

Conductive vias 320 are formed extending through the core 310. The conductive vias 320 comprise a conductive material 320A such as copper, a copper alloy, or other conductors, and may include a barrier layer (not shown), liner (not shown), seed layer (not shown), and/or a fill material 320B, in some embodiments. The conductive vias 320 provide vertical electrical connections from one side of the core 310 to the other side of the core 310. For example, some of the conductive vias 320 are coupled between conductive features at one side of the core 310 and conductive features at an opposite side of the core 310. Holes for the conductive vias 320 may be formed using a drilling process, photolithography, a laser process, or other methods, as examples, and the holes of the conductive vias 320 are then filled or plated with conductive material. In some embodiments, the conductive vias 320 are hollow conductive through vias having centers that are filled with an insulating material. Redistribution structures 340A and 340B are formed on opposing sides of the core 310. The redistribution structures 340A and 340B are electrically coupled by the conductive vias 320, and fan-in/fan-out electrical signals.

The redistribution structures 340A and 340B each include dielectric layers, formed of ABF, pre-preg, or the like, and metallization patterns. Each respective metallization pattern has line portions on and extending along a major surface of a respective dielectric layer, and has via portions extending through the respective dielectric layer. The redistribution structures 340A and 340B each, respectively, include under-bump metallurgies (UBMs) 330A and 330B for external connection, and solder resists 350A and 350B protecting the features of the redistribution structures 340A and 340B. The redistribution structure 340A is attached to the redistribution structure 200 by the UBMs 330A through the conductive connectors 390 as illustrated in FIG. 24. More or fewer dielectric layers and metallization patterns may be formed in the redistribution structures 340A and 340B than shown in FIG. 24.

The core substrate 300 may include active and passive devices (not shown), or may be free from either active devices, passive devices, or both. A wide variety of devices such as transistors, capacitors, resistors, inductors, combinations of these, and the like may be used. The devices may be formed using any suitable methods.

Conductive connectors 390 may be used to bond the core substrates 300A and 300B to the redistribution structure 200 as illustrated in FIG. 18. The conductive connectors 390 may be first formed on either of the core substrates 300A and 300B, or on the conductive pads 214 of the redistribution structure 200, and then reflowed to complete the bond. For example, in the embodiment shown in FIG. 24, conductive connectors 390 are formed on UBMs 330A of the bottom redistribution structure 340A with a pitch in a range of about 20 µm to about 500 µm. The conductive connectors 390 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 390 may include a conductive material such as solder, copper, aluminum, gold, nickel, silver, palladium, tin, the like, or a combination thereof. Integration of such conductive connectors 390 may provide flexibility in placement for semiconductor devices, such as integrated passive device (IPD) chips, integrated voltage regulators (IVRs), active chips, among other electrical components, to implement system-on-a-chip type of package components, thus reducing fabrication complexity. Such embodiments may also provide a greater amount of flexibility for various other package configurations as well.

In some embodiments, the conductive connectors 390 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 390 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, the core substrate 300 may be placed on the redistribution structure 200 using a pick and place process or another suitable process and the conductive connectors 390 bonded by flip chip bonding process or other suitable bonding process. In some embodiments, the conductive connectors 390 are reflowed to attach the core substrates 300A and 300B to the redistribution structure 200 by way of conductive pads 214. The conductive connectors 390 electrically and/or physically couple the core substrate 300 to the redistribution structure 200 and through the local interconnect components 120 to integrated circuit dies 512, 514, and 516. The double-sided connection of the integrated circuit dies 512, 514, and 516 to each other and to the core substrate 300 through the local interconnect component 120 may increase the communication bandwidth between the integrated circuit dies while maintaining low contact resistance and high reliability, which may achieve high signal integrity and power integrity. Power distribution networks with two-sided connections through the local interconnect components may be managed without a significant voltage drop.

The conductive connectors 390 may have an epoxy flux (not shown) formed thereon before they are reflowed with at least some of the epoxy portion of the epoxy flux remaining after the core substrate 300 is attached to the redistribution structure 200.

In some embodiments, an underfill 380, as shown in FIG. 24, is formed surrounding the conductive connectors 390 between the redistribution structure 200 and the core substrate 300. The underfill 380 may reduce stress and protect the joints resulting from the reflowing of the conductive connectors 390. The underfill 380 may be formed by a capillary flow process after the redistribution structure 200 is attached, or may be formed by a suitable deposition method. In some embodiments, a single layer of underfill 380 is formed beneath multiple adjacent devices, and further subsequent underfills (not shown) or encapsulants (not shown) may be formed beneath and/or around additional devices placed on top of the singulated package component 100.

External connectors 620, as shown in FIG. 24, are formed on the UBMs 330B of the core substrate 300. The external connectors 620 may be ball grid array (BGA) connectors, solder balls, metal pillars, controlled collapse chip connection (C4) bumps, micro bumps, or the like. The external connectors 620 may include a conductive material such as solder, copper, aluminum, gold, nickel, silver, palladium, tin, the like, or a combination thereof. In some embodiments, the external connectors 620 are formed by initially forming a layer of reflowable material on the UBMs 330 through evaporation, electroplating, printing, solder transfer, ball placement, or the like. Once a layer of reflowable material has been formed on the UBMs 330B a reflow may be performed in order to shape the material into the desired bump shapes.

Embodiments may achieve advantages. For example, embedded double-sided local interconnect component may increase the communication bandwidth between the integrated circuit dies while maintaining low contact resistance and high reliability. The embedded double-sided local interconnect component may increase the communication bandwidth between the integrated circuit dies while maintaining low contact resistance and high reliability. The double-sided local interconnect connections may achieve high signal integrity and power integrity, and may enable power distribution networks to be managed through the two-sided connection without a significant voltage drop. Forming double-sided local interconnect components without adhesives such as die attach films may allow the reliability window to be enlarged. The formation of compound cracks between attached integrated circuit dies may be reduced by omitting a grinding process step to remove the adhesive, improving device reliability.

In accordance with an embodiment, a semiconductor structure includes: a first redistribution structure, the first redistribution structure including a first redistribution layer, the first redistribution layer including a first dielectric layer and a first metallization layer; a first local interconnect component disposed on the first redistribution structure, sidewalls of the first local interconnect component being surrounded by an encapsulant, the first local interconnect component including a first plurality of redistribution layers, the first plurality of redistribution layers including a first plurality of conductive features on a first side of the first local interconnect component, the first side physically contacting the first redistribution layer, each of the first plurality of conductive features being physically and electrically coupled to respective conductive features of the first metallization layer; and a first interconnect structure over a second side of the first local interconnect component, the second side being opposite the first side, the first interconnect structure including a second plurality of conductive features and a third plurality of conductive features, the second plurality of conductive features being electrically coupled to the third plurality of conductive features through the first local interconnect component. In an embodiment, the semiconductor structure further includes: a first integrated circuit die physically and electrically coupled to the first interconnect structure opposite the first local interconnect component, the first integrated circuit die being electrically coupled to the second plurality of conductive features of the first interconnect structure; and a second integrated circuit die physically and electrically coupled to the first interconnect structure opposite the first local interconnect component, the second integrated circuit die being adjacent to the first integrated circuit die, the second integrated circuit die being electrically coupled to the third plurality of conductive features of the first interconnect structure. In an embodiment, the semiconductor structure further includes: a plurality of through vias extending through the encapsulant, a bottom surface of each through via of the plurality of through vias being coupled to a respective conductive feature of the first redistribution structure, a top surface of each through via of the plurality of through vias being coupled to a respective conductive feature of the first interconnect structure. In an embodiment, the semiconductor structure further includes a semiconductor package attached to the first redistribution structure opposite the first local interconnect component, the semiconductor package being coupled to the first redistribution structure by a plurality of conductive connectors. In an embodiment, the semiconductor package is a core substrate. In an embodiment, the semiconductor structure further includes: the semiconductor package is electrically coupled to the first interconnect structure through the first local interconnect component. In an embodiment, the semiconductor structure further includes: the first local interconnect component includes a first metal pillar, the first metal pillar physically contacting a bottom surface of the first interconnect structure, sidewalls of the first metal pillar being covered by the encapsulant. In an embodiment, the semiconductor structure further includes: the first plurality of conductive features of the first local interconnect component includes a second metal pillar, a bottom surface of the second metal pillar physically contacting the first redistribution structure. In an embodiment, the semiconductor structure further includes: the first local interconnect component further includes a dielectric material, sidewalls of the second metal pillar being covered by the dielectric material.

In accordance with another embodiment, a semiconductor device includes: a back-side redistribution structure, the back-side redistribution structure including a first metallization pattern and a first dielectric layer; a first local interconnect component, a bottom side of the first local interconnect component being attached to a top side of the back-side redistribution structure, a first plurality of conductive features being on the bottom side of the first local interconnect component, the first plurality of conductive features being physically and electrically coupled to the first metallization pattern; a first encapsulant on the back-side redistribution structure, the first encapsulant covering sidewalls of the first local interconnect component; a first integrated circuit die on the first encapsulant, the first integrated circuit die over a first portion of the first local interconnect component, the first integrated circuit die being electrically coupled to the first local interconnect component; and a second integrated circuit die on the first encapsulant, the second integrated circuit die over a second portion of the first local interconnect component, the second integrated circuit die being electrically coupled to the first integrated circuit die through the first local interconnect component. In an embodiment, the semiconductor device further includes a first through via and a second through via on the back-side redistribution structure, the first through via and the second through via extending through the first encapsulant, the first through via being electrically coupled to the first integrated circuit die, the second through via being coupled to the second integrated circuit die. In an embodiment, the semiconductor device further includes a first through via and a second through via on the back-side redistribution structure, the first through via and the second through via extending through the first encapsulant, the first through via being electrically coupled to the first integrated circuit die, the second through via being coupled to the second integrated circuit die. In an embodiment, the semiconductor device further includes an interconnect structure over the first local interconnect component and the first encapsulant, the first integrated circuit die and the second integrated circuit die attached to the interconnect structure opposite the first local interconnect component. In an embodiment, the semiconductor device further includes a third integrated circuit die attached to the interconnect structure neighboring the first integrated circuit die. In an embodiment, the semiconductor device further includes a second local interconnect component, a bottom side of the second local interconnect component being attached to a top side of the back-side redistribution structure, the first encapsulant covering sidewalls of the second local interconnect component, a first portion of the second local interconnect component being under the first integrated circuit die, a second portion of the second local interconnect component being under the third integrated circuit die. In an embodiment, the semiconductor device further includes the third integrated circuit die being electrically coupled to the first integrated circuit die through the second local interconnect component. In an embodiment, the semiconductor device further includes a semiconductor package attached to the back-side redistribution structure opposite the interconnect structure, the second integrated circuit die being electrically coupled to the semiconductor package through the first local interconnect component, the third integrated circuit die being electrically coupled to the semiconductor package through the second local interconnect component.

In accordance with yet another embodiment, a method of forming a semiconductor device includes: forming a first plurality of redistribution layers on a first substrate; forming a first plurality of connectors on the first plurality of redistribution layers; singulating the first substrate, the first plurality of redistribution layers, and the first plurality of connectors into a plurality of local interconnect structures, a first local interconnect structure of the plurality of local interconnect structures including: a singulated portion of the first substrate; a singulated portion of the first plurality of redistribution layers on the singulated portion of the first substrate; and a second plurality of connectors on the singulated portion of the first plurality of redistribution layers, the second plurality of connectors being a subset of the first plurality of connectors; attaching the first local interconnect structure to a second substrate; forming a first encapsulant over the first local interconnect structure and the second substrate; removing a top portion of the first encapsulant and removing the singulated portion of the first substrate from the first local interconnect structure; forming a first redistribution structure over a first side of the first local interconnect structure and the first encapsulant; removing the first local interconnect structure, the first encapsulant, and the first redistribution structure from the second substrate and attaching the first redistribution structure to a third substrate; forming a second redistribution structure over a second side of the first local interconnect structure and the first encapsulant, the second side being opposite the first side; and attaching a first integrated circuit die and a second integrated circuit die to the second redistribution structure, the first integrated circuit die being electrically coupled to the second integrated circuit die through the first local interconnect structure. In an embodiment, forming the first plurality of connectors includes forming a plurality of metal pillars on the first plurality of redistribution layers. In an embodiment, the method further includes attaching a semiconductor package to the first redistribution structure opposite the second redistribution structure, the semiconductor package being electrically coupled to the first local interconnect structure through the first redistribution structure.

Embodiments discloses herein may provide for a method including forming a first plurality of redistribution layers on a first substrate, forming a first plurality of connectors on the first plurality of redistribution layers, and singulating the first substrate, the first plurality of redistribution layers, and the first plurality of connectors into a plurality of local interconnect structures. A first local interconnect structure of the plurality of local interconnect structures comprises: a singulated portion of the first substrate, a singulated portion of the first plurality of redistribution layers on the singulated portion of the first substrate, and a second plurality of connectors on the singulated portion of the first plurality of redistribution layers, the second plurality of connectors being a subset of the first plurality of connectors. The method further includes attaching the first local interconnect structure to a second substrate, forming a first encapsulant over the first local interconnect structure and the second substrate, removing a top portion of the first encapsulant and removing the singulated portion of the first substrate from the first local interconnect structure, forming a first redistribution structure over a first side of the first local interconnect structure and the first encapsulant, removing the first local interconnect structure, the first encapsulant, and the first redistribution structure from the second substrate and attaching the first redistribution structure to a third substrate. The method further includes forming a second redistribution structure over a second side of the first local interconnect structure and the first encapsulant, the second side being opposite the first side, and attaching a first integrated circuit die and a second integrated circuit die to the second redistribution structure, the first integrated circuit die being electrically coupled to the second integrated circuit die through the first local interconnect structure.

Other embodiments disclosed herein may provide for a method including forming on a first carrier substrate a plurality of local interconnect structures, each local interconnect structure including a stack of metallization lines embedded within respective dielectric layers of a stack of dielectric layers, singulating the plurality of local interconnect structures into individual local interconnect structures, forming conductive vias adjacent the local interconnect structure, encapsulating the individual local interconnect structure and the adjacent conductive vias in an encapsulant, forming a back-side redistribution structure electrically contacting the local interconnect structure and extending over a back-side of the encapsulant, forming a front-side redistribution structure electrically contacting the local interconnect structure and extending over a front-side of the encapsulant, and bonding an integrated circuit package to the front-side redistribution structure, wherein the integrated circuit package includes a first integrated circuit and a second integrated circuit further wherein the first integrated circuit is in electrical communication with the second integrated circuit through the individual local interconnect structure.

Yet other embodiments disclosed herein may provide for a method including forming a first local interconnect component and a conductive via surrounded by an encapsulant, the first local interconnect component comprising a first plurality of redistribution layers, the first plurality of redistribution layers comprising a first plurality of conductive features on a first side of the first local interconnect component, the first side physically contacting the first redistribution layer, forming a first redistribution structure on a first side of the encapsulant and being in electrical contact with external electrical connectors of the first local interconnect. The first redistribution structure comprises a first redistribution layer, the first redistribution layer comprising a first dielectric layer and a first metallization layer. The method further includes forming a second redistribution structure on a second side of the encapsulant, opposite the first side of the encapsulant, the second redistribution structure being in electrical communication with the local interconnect structure, the conductive via providing an electrical communication path between the first redistribution structure and the second redistribution structure, and bonding an integrated circuit package to the second redistribution structure, the integrated circuit package including a first integrated circuit and a second integrated circuit, wherein the local interconnect structure provides an electrical communication path between the first integrated circuit and the second integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first plurality of redistribution layers on a first substrate;
   forming a first plurality of connectors on the first plurality of redistribution layers;
   singulating the first substrate, the first plurality of redistribution layers, and the first plurality of connectors into a plurality of local interconnect structures, a first local interconnect structure of the plurality of local interconnect structures comprising:
      a singulated portion of the first substrate;
      a singulated portion of the first plurality of redistribution layers on the singulated portion of the first substrate;
      a second plurality of connectors on the singulated portion of the first plurality of redistribution layers, the second plurality of connectors being a subset of the first plurality of connectors;
   attaching the first local interconnect structure to a second substrate;
   forming a first encapsulant over the first local interconnect structure and the second substrate;
   removing a top portion of the first encapsulant and removing the singulated portion of the first substrate from the first local interconnect structure;
   forming a first redistribution structure over a first side of the first local interconnect structure and the first encapsulant;
   removing the first local interconnect structure, the first encapsulant, and the first redistribution structure from the second substrate and attaching the first redistribution structure to a third substrate;
   forming a second redistribution structure over a second side of the first local interconnect structure and the first encapsulant, the second side being opposite the first side; and
   attaching a first integrated circuit die and a second integrated circuit die to the second redistribution structure, the first integrated circuit die being electrically coupled to the second integrated circuit die through the first local interconnect structure.

2. The method of claim 1, wherein forming the first plurality of connectors comprises forming a plurality of metal pillars on the first plurality of redistribution layers.

3. The method of claim 1, further comprising attaching a semiconductor package to the first redistribution structure opposite the second redistribution structure, the semiconductor package being electrically coupled to the first local interconnect structure through the first redistribution structure.

4. The method of claim 1, further comprising forming conductive vias on the second substrate, the conductive vias being adjacent the first local interconnect structure.

5. The method of claim 4, wherein the first encapsulant also surrounds the conductive vias.

6. The method of claim 1, further comprising depositing an underfill surrounding the first plurality of connectors.

7. A method comprising:
   forming on a first carrier substrate a plurality of local interconnect structures, each local interconnect structure including a stack of metallization lines embedded within respective dielectric layers of a stack of dielectric layers;
   singulating the plurality of local interconnect structures into individual local interconnect structures;
   forming conductive vias adjacent at least one local interconnect structure;
   encapsulating the individual local interconnect structure and the adjacent conductive vias in an encapsulant;
   forming a back-side redistribution structure electrically contacting the local interconnect structure and extending over a back-side of the encapsulant;
   forming a front-side redistribution structure electrically contacting the local interconnect structure and extending over a front-side of the encapsulant;
   bonding an integrated circuit package to the front-side redistribution structure, wherein the integrated circuit package includes a first integrated circuit and a second integrated circuit further wherein the first integrated circuit is in electrical communication with the second integrated circuit through the individual local interconnect structure.

8. The method of claim 7, wherein the step of forming conductive vias adjacent the local interconnect structure comprises:
   mounting the local interconnect structure to a carrier substrate; and
   forming the conductive vias on the carrier substrate.

9. The method of claim 8, further comprising: injecting an underfill material between the local interconnect structure and the carrier substrate.

10. The method of claim 9, further comprising removing the carrier substrate.

11. The method of claim 7, wherein the step of bonding the integrated circuit package to the front-side redistribution structure further includes flowing an underfill material between the integrated circuit package and the front-side redistribution structure.

12. The method of claim 7, wherein the step of bonding the integrated circuit package to the front-side redistribution structure includes positioning the integrated circuit package so that a projection of the periphery of the first integrated circuit overlaps with the local interconnect structure at a first side of the local interconnect structure, and a projection of the periphery of the second integrated circuit overlaps with the local interconnect structure at a second side of the local interconnect structure, opposite the first side.

13. The method of claim 7, further comprising a planarizing step wherein a portion of the encapsulant and the first carrier substrate are removed.

14. A method comprising:
forming a first local interconnect component and a conductive via surrounded by an encapsulant, the first local interconnect component comprising a first plurality of redistribution layers, the first plurality of redistribution layers comprising a first plurality of conductive features on a first side of the first local interconnect component, the first side physically contacting a first redistribution layer of the first plurality of redistribution layers;
forming a first redistribution structure on a first side of the encapsulant and being in electrical contact with external electrical connectors of the first local interconnect component, the first redistribution structure comprising a first redistribution layer, the first redistribution layer comprising a first dielectric layer and a first metallization layer;
forming a second redistribution structure on a second side of the encapsulant, opposite the first side of the encapsulant, the second redistribution structure being in electrical communication with the first local interconnect component, the conductive via providing an electrical communication path between the first redistribution structure and the second redistribution structure;
bonding an integrated circuit package to the second redistribution structure, the integrated circuit package including a first integrated circuit and a second integrated circuit, wherein the first local interconnect component provides an electrical communication path between the first integrated circuit and the second integrated circuit.

15. The method of claim 14, wherein the step of forming the first local interconnect component and the conductive via surrounded by an encapsulant comprises:
forming the conductive via on a carrier substrate;
mounting the local interconnect component to the carrier substrate;
encapsulating the conductive via and the first local interconnect component in the encapsulant;
planarizing the encapsulant to expose a top portion of the conductive via; and
removing the carrier substrate.

16. The method of claim 15, wherein the step of forming the conductive via on the carrier substrate comprises:
forming a metallization pattern on the carrier substrate; and
plating metal pillars on the metallization pattern.

17. The method of claim 15, further comprising forming an underfill material between the first local interconnect component and the carrier substrate.

18. The method of claim 14, further comprising electrically connecting the local interconnect component to the second redistribution structure using a solder free connection.

19. The method of claim 14, further comprising mounting the first redistribution structure to a core substrate.

20. The method of claim 14, wherein the step of forming a first local interconnect component comprises:
forming a plurality of local interconnect components on a common substrate;
singulating the common substrate into individual local interconnect components; and
mounting the individual local interconnect component onto a carrier substrate.

* * * * *